United States Patent
Lunsman et al.

(10) Patent No.: US 10,667,431 B1
(45) Date of Patent: May 26, 2020

(54) MEMORY MODULE COOLING

(71) Applicant: HEWLETT PACKARD ENTERPRISE DEVELOPMENT LP, Houston, TX (US)

(72) Inventors: Harvey J. Lunsman, Chippewa Falls, WI (US); John Franz, Houston, TX (US); Tahir Cader, Liberty Lake, WA (US); Ernesto Ferrer Medina, Aguadilla, PR (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/398,115

(22) Filed: Apr. 29, 2019

(51) Int. Cl.
*G06F 1/20* (2006.01)
*H05K 7/20* (2006.01)
*H05K 1/02* (2006.01)

(52) U.S. Cl.
CPC ............ *H05K 7/2039* (2013.01); *G06F 1/20* (2013.01); *H05K 1/0203* (2013.01); *H05K 7/20254* (2013.01); *G06F 2200/201* (2013.01); *H05K 2201/066* (2013.01); *H05K 2201/10159* (2013.01); *H05K 2201/10393* (2013.01)

(58) Field of Classification Search
CPC ............. H05K 1/0203; H05K 7/2039; H05K 7/20254; H05K 2201/066; H05K 2201/10159; H05K 2201/10393; G06F 1/20; G06F 2200/201
See application file for complete search history.

(56) References Cited

U.S. PATENT DOCUMENTS

| | | |
|---|---|---|
| 7,365,985 B1 | 4/2008 | Ni |
| 7,715,197 B2 | 5/2010 | Tian et al. |
| 8,081,474 B1 * | 12/2011 | Zohni .................. H01L 23/367 257/719 |

(Continued)

FOREIGN PATENT DOCUMENTS

WO    WO-2018236388 A1    12/2018

OTHER PUBLICATIONS

Arthur K. Farnsworth, "Integrated Heat Pipe Spreader for Improved FBDIMM Memory Module Thermal Management," Electronics Cooling, Nov. 1, 2008, pp. 1-9 (online), ITEM Media, Retrieved from the Internet on Mar. 1, 2019 at URL.<electronics-cooling.com/2008/11/integrated-heat-pipe-spreader-for-improved-fbdimm-memory-module-thermal-management/>.

(Continued)

*Primary Examiner* — Jacob R Crum
(74) *Attorney, Agent, or Firm* — Hewlett Packard Enterprise Patent Department

(57) ABSTRACT

An example thermal interface device to attach to and cool a memory module. The device includes two sides sections that cover and contact the side faces of the memory module when installed. The device includes an outer layer that is a thermally conductive and resilient material, and an inner layer that is a thermally conductive and malleable metal. The inner layer may be nested within the outer layer, and the inner layer contacts the memory circuits of the memory module when installed. The outer layer includes spring fingers extending outward so as to contact and be compressed by a heat transfer device, such as a heat pipe, that is positioned on a side of the memory module. A thermally conductive path is thereby provided between the memory module and the heat transfer device via the thermal interface device.

20 Claims, 23 Drawing Sheets

(56) References Cited

U.S. PATENT DOCUMENTS

| | | | |
|---|---|---|---|
| 8,125,780 B2 | 2/2012 | Goth et al. | |
| 9,076,753 B2 * | 7/2015 | Iyengar | H01L 23/3672 |
| 2007/0206360 A1 * | 9/2007 | Chu | G06F 1/20 |
| | | | 361/715 |
| 2008/0186685 A1 * | 8/2008 | Cho | H05K 1/0207 |
| | | | 361/737 |
| 2009/0034183 A1 * | 2/2009 | Chen | G06F 1/20 |
| | | | 361/679.47 |
| 2009/0109613 A1 | 4/2009 | Legen et al. | |
| 2009/0241340 A1 * | 10/2009 | Myung | G06F 1/20 |
| | | | 29/890.03 |
| 2010/0025010 A1 * | 2/2010 | Cipolla | H01L 23/4093 |
| | | | 165/47 |
| 2012/0103564 A1 * | 5/2012 | Ye | G06F 1/20 |
| | | | 165/67 |
| 2012/0188707 A1 * | 7/2012 | Chen | G06F 1/20 |
| | | | 361/679.54 |
| 2012/0320523 A1 * | 12/2012 | Murakami | G06F 1/20 |
| | | | 361/679.54 |

OTHER PUBLICATIONS

Ian Cutress, "Managing 8 Rome CPUs in 1U: Cray's Shasta Direct Liquid Cooling", available online at <https://www.anandtech.com/show/13616/managing-16-rome-cpus-in-1u-crays-shasta-direct-liquid-cooling>, Nov. 19, 2018, 5 pages.

* cited by examiner

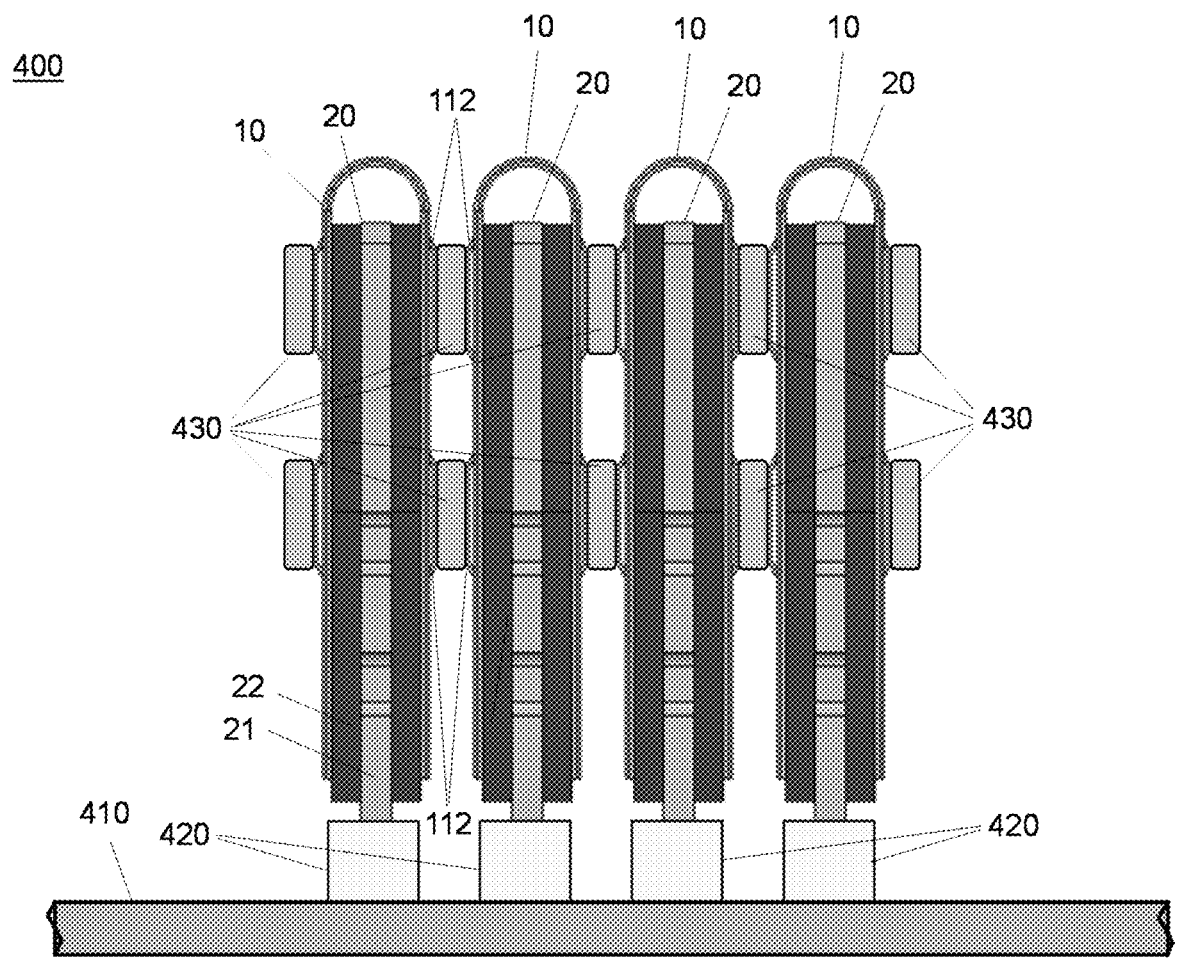

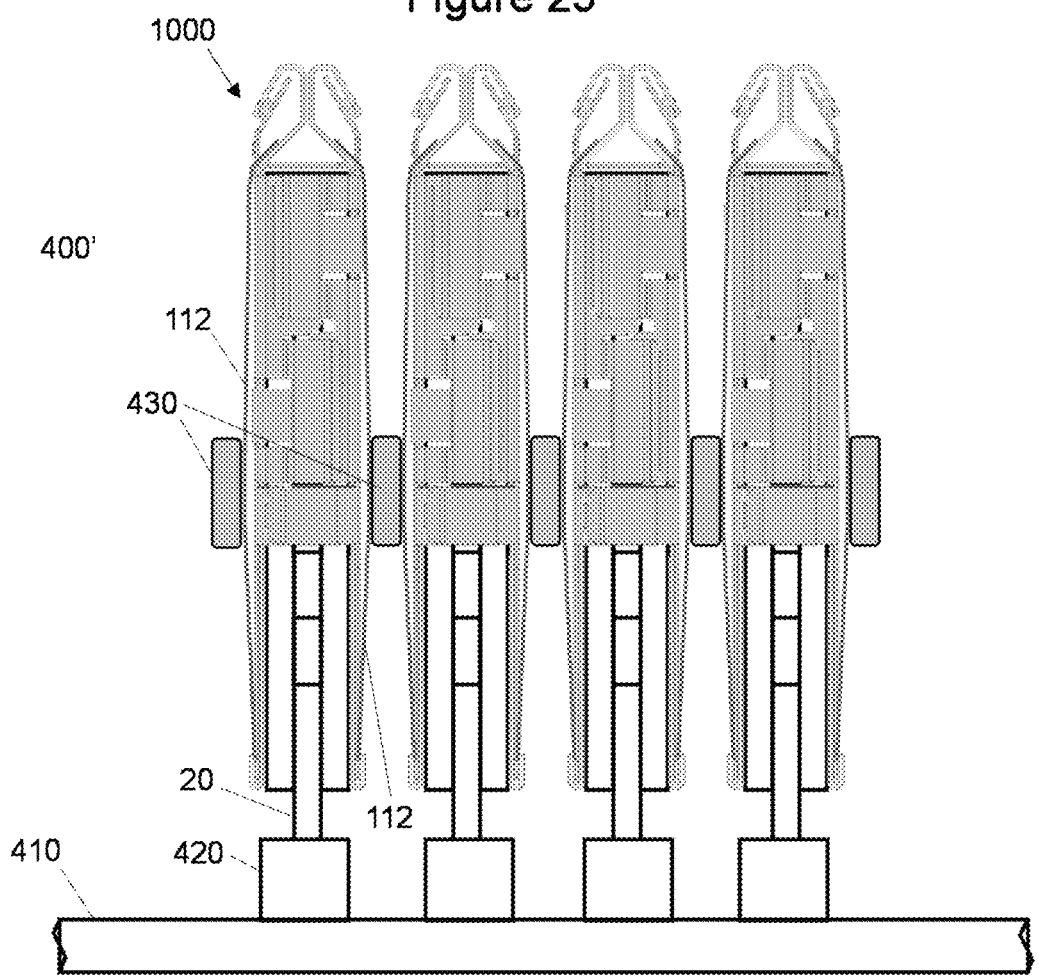

MEMORY MODULE COOLING

BACKGROUND

Computers may include memory modules. When in use, the memory modules may generate excessive heat, which may adversely affect the memory modules and/or other components of the computer.

BRIEF DESCRIPTION OF THE DRAWINGS

FIG. 11 illustrates an example computing device that includes the example interface device of FIG. 1.

FIG. 25 illustrates an example computing device that includes the example interface device of FIG. 16.

DETAILED DESCRIPTION

Figure 1:
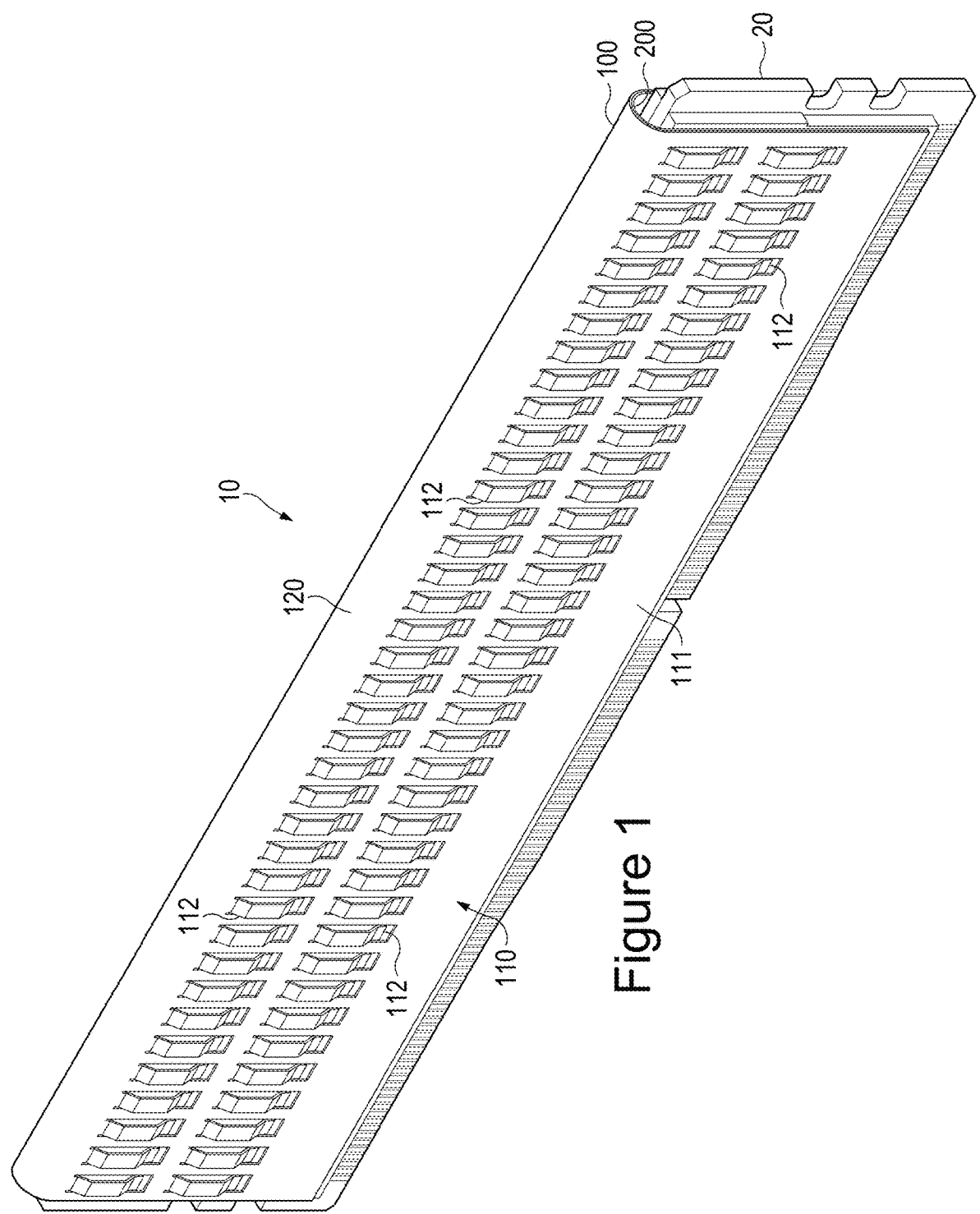
FIG. 1 illustrates a perspective view of an example thermal interface device.
Figure 2:
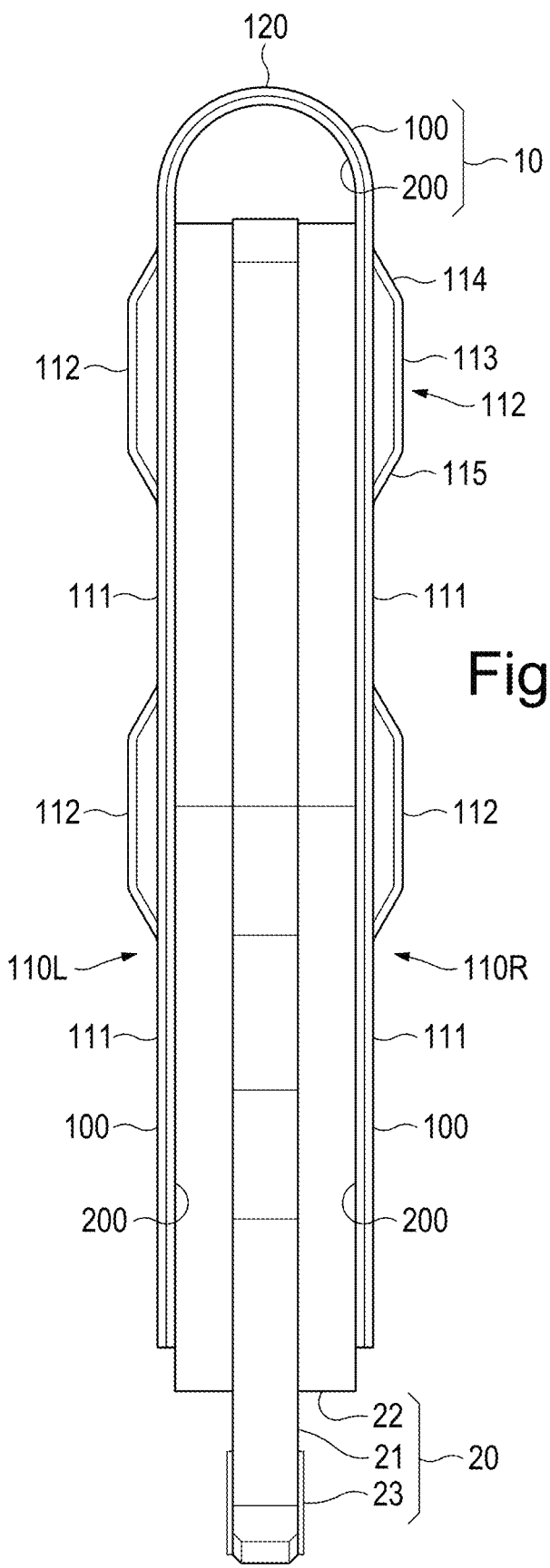
FIG. 2 illustrates a front plan view of the example thermal interface device of FIG. 1.

One approach to cooling memory modules is to cause air to flow directly over/around the memory modules. However, in some circumstances, this approach of blowing air directly onto the memory modules may be suboptimal. For example, some systems may be designed to have no air flowing through them at all, in which case this approach to cooling the memory modules is not even possible. Furthermore, even in systems that do include flows of air, flowing the air directly over the memory modules might not always be sufficient to cool the memory modules to the extent desired while maintaining other desired parameters (e.g., size of the computing device, fan speed, etc.). Furthermore, memory module power consumption levels are already at, and will soon exceed, 12 W per module. This level of power consumption will make it extremely difficult to cool the modules with air.

Thus, this disclosure describes example memory module cooling systems and devices to enable better cooling of memory modules. In particular, example memory module cooling systems include a number of devices that thermally couple the memory modules to a heat sink or liquid-cooled cold plate, so that heat generated by the memory modules is transferred to the heat sink or cold plate and dissipated from there into a flow of a cooling medium (air or liquid), which then carries the heat out of the computing system.

More particularly, the examples disclosed herein may include thermal interface devices ("interface devices") that are to attach to the memory modules and provide a thermally conductive path between the memory module and a thermal transfer device (such as a heat pipe). Each interface device attaches to an individual memory module such that side portions of the interface device are in contact with memory chips of the memory module. The interface device also includes spring fingers extending outward, which are to contact a heat transfer device positioned on a side of the memory module. Because the interface device is thermally conductive and in contact with the memory module and the heat transfer device, it therefore provides a thermally conductive path between the memory module and the heat transfer device.

The heat transfer device is thermally coupled to a heat sink or cold plate (either directly or via additional thermal devices), and therefore when the interface devices and the heat transfer devices are installed in a computer system, heat generated by the memory modules flows to the heat sink or cold plate. This enables superior cooling of the memory modules, and may be particularly beneficial in those situations in which no air flows through the computing device.

Importantly, in some examples the interface devices include two layers of different thermally conductive materials (e.g., two different metals) having different physical properties—specifically, an outer layer that is relatively more resilient and robust (e.g., hard copper or aluminum), and an inner layer that is relatively soft (more malleable) (e.g., annealed copper).

The ductility/malleability of the inner layer enables it to deform to conform to the contours of the memory module, thereby improving the thermal contact between the interface device and the memory module. In some examples, the conforming of the inner layer may provide sufficiently good thermal contact that it is not necessary to include a traditional thermal interface material (TIM), such as a thermal gap pad, thermal grease, or thermal paste, between the interface device and the memory module. This may be beneficial, as such traditional TIMs may increase the complexity of installing the thermal device, along with increasing the cost of the overall solution. Furthermore, greases/pastes may need to be reapplied whenever the thermal device is removed and may leave residue transferred to both surfaces in contact therefore requiring cleaning before reapplication, and gap pads may be easy to damage during installation of the thermal device, may be undesirably thick, and may have relatively lower thermal conductivity than the malleable inner layer.

The resilience of the outer layer may enable the spring fingers to act as springs, so that when the spring figures are displaced or compressed by contact with the thermal transfer device, they are not permanently deformed and they push back with a restoring spring force. This restoring spring force biases the spring fingers outward (i.e., away from the memory module), which may help to ensure that the spring fingers maintain contact with the thermal transfer device even if the thermal transfer device is not perfectly aligned (e.g., if it moves slightly after initial installation, or there are surface undulations due to manufacturing or handling). In addition, in some examples the displacement (compression) of the spring fingers may also generate forces that press the inner layer against the memory module, thereby helping to maintain good thermal contact between the inner layer and the memory module.

The construction of the interface device from the outer layer and the inner layer nested together may enable each of the layers to compensate for certain disadvantages of the other layer, making the combined assembly better than the sum of its parts. For example, malleable metals may not be very resilient, and thus the spring fingers of an interface device made solely of this material might not provide a sufficiently strong restoring spring force to maintain good thermal contact. Moreover, such malleable metals may be susceptible to damage during installation and/or use of the interface device. However, by layering the more resilient outer layer over the inner layer, the outer layer may provide sufficiently strong spring force and may protect the inner layer from damage. In addition, resilient metals may not be very malleable, and thus would not conform very well to the contours of the memory modules, resulting in a relatively poor thermal interface. In addition, a resilient metal may damage the memory modules during installation. However, by layering the more malleable inner layer under the outer layer, the inner layer may provide the desired thermal contact with the memory module without requiring a TIM, and may protect the memory modules from being damaged by the outer layer. Moreover, memory modules have varying thickness depending on vendor, capacity, etc. Thus, the resilient outer layer and conformal inner layer work together to ensure that that all surfaces remain in contact regardless of the dimensions and tolerances of both the memory module or the system in which they are installed therein.

Additional advantageous features of the example interface devices will be described in greater detail below with reference to certain detailed implementation examples. It should be understood that the implementation examples described below are merely some examples of how the interface devices could be implemented, and that other examples of the interface devices could omit some of the features described below and/or could include additional features not described below. Moreover, it should be understood that features described in relation to one implementation example could be included in another implementation example even if not shown or described.

1. First Example Thermal Interface Devices and Computing Systems

A first example thermal interface device 10 ("interface device 10") will now be described with reference to FIGS. 1-15. Because certain features are visible in many of the figures, to avoid duplicative description the figures will not be described separately. Instead, each feature will be described, and certain figures that are relevant to that feature will be identified parenthetically.

Figure 3:
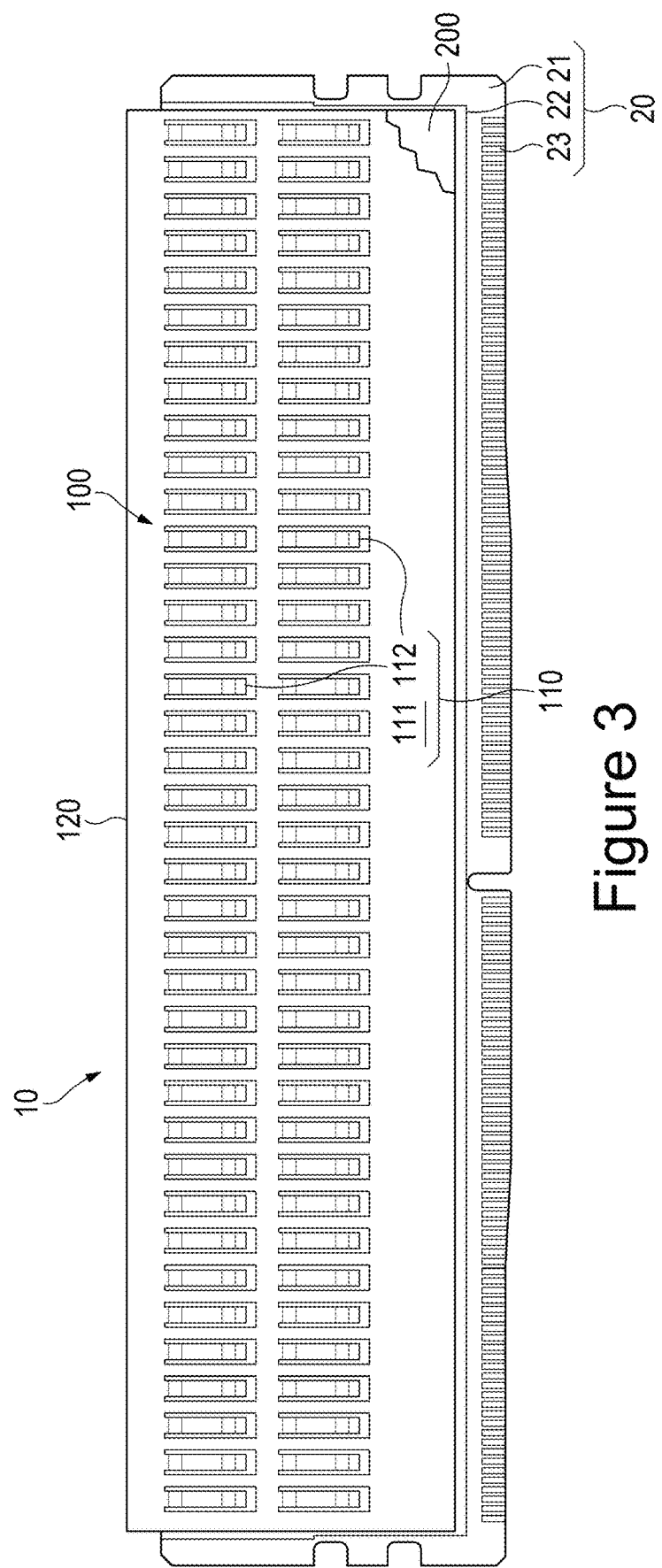
FIG. 3 illustrates a side plan view of the example thermal interface device of FIG. 1.
Figure 4:
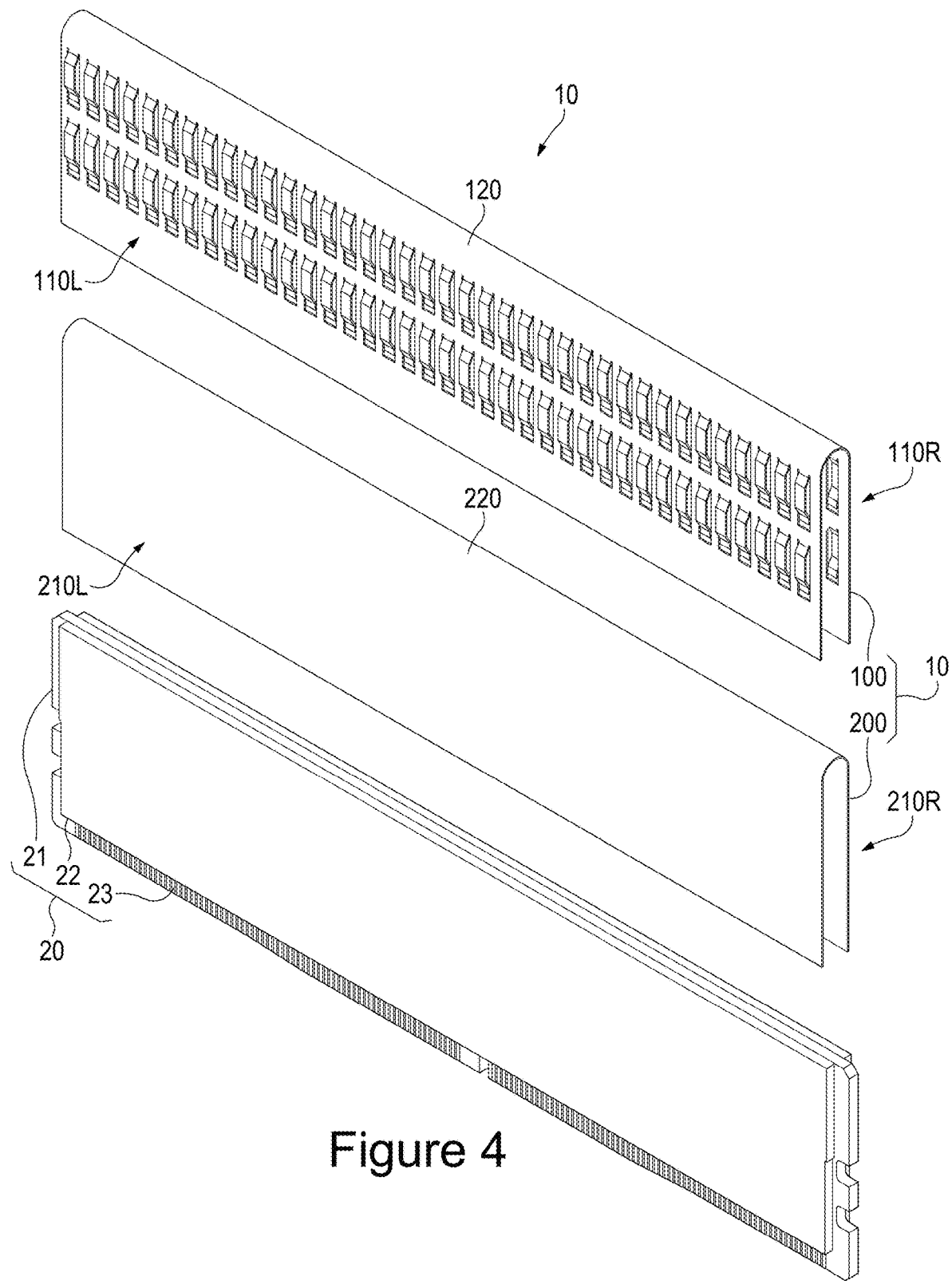
FIG. 4 illustrates an exploded perspective view of the example thermal interface device of FIG. 1.
Figure 5:
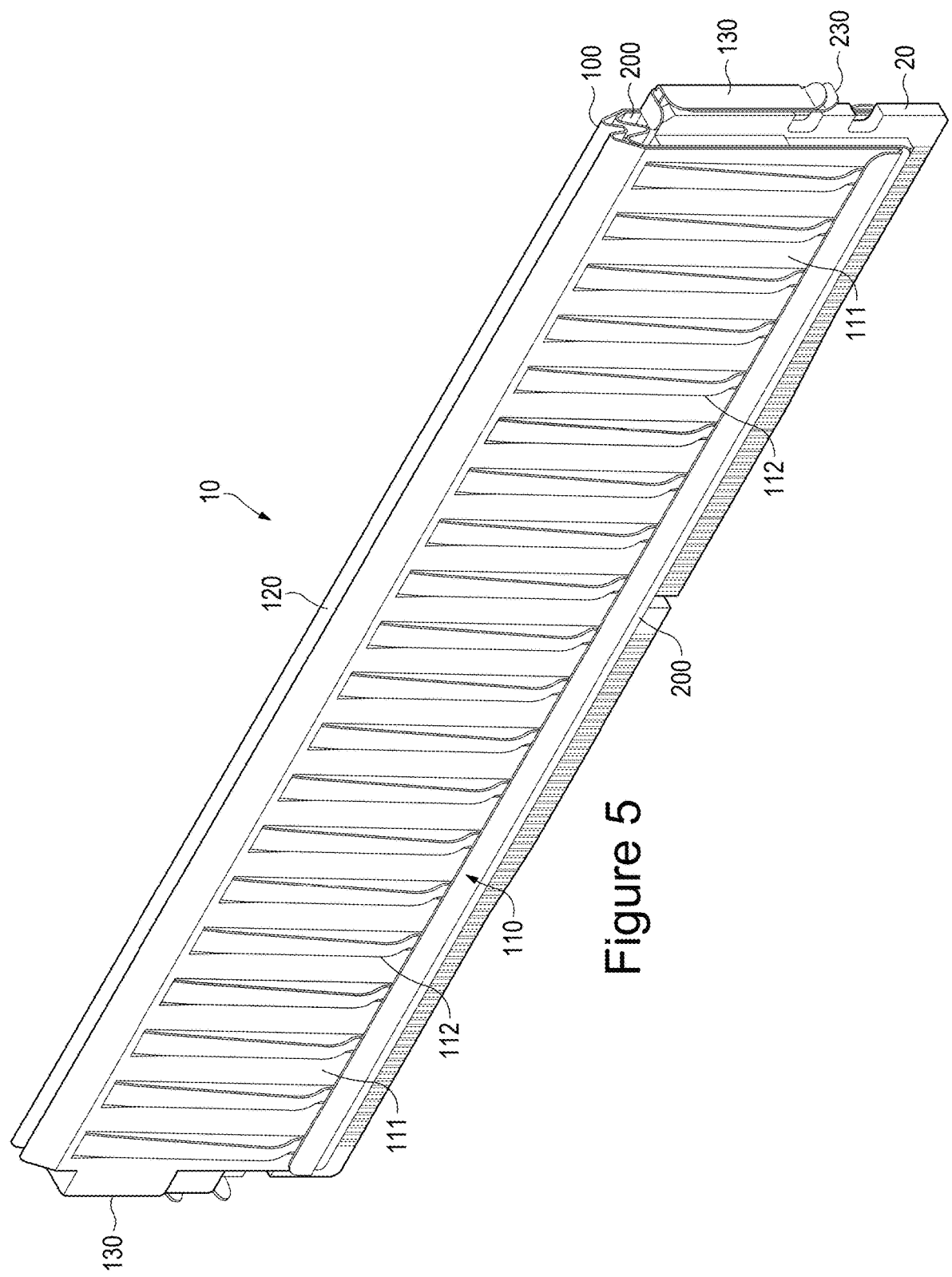
FIG. 5 illustrates a perspective view of an example thermal interface device.
Figure 8:
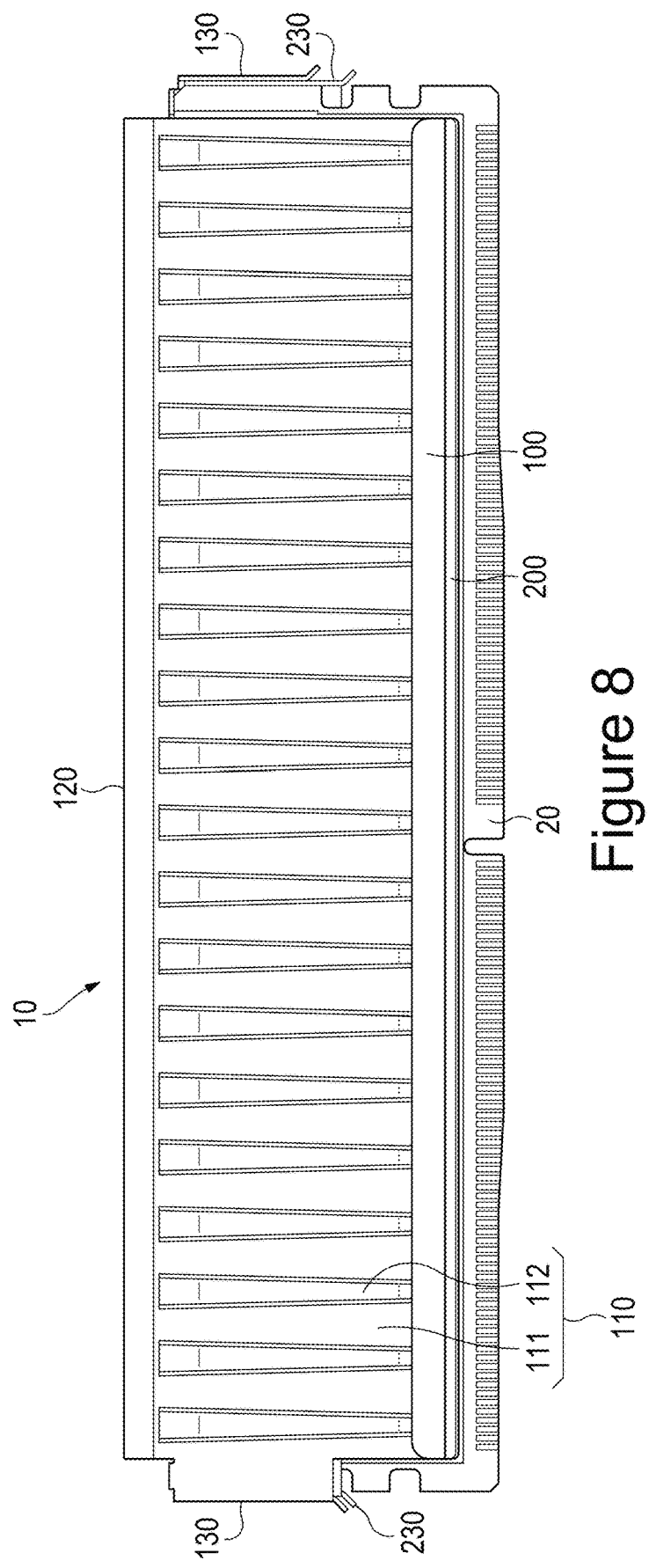
FIG. 8 illustrates a side plan view of the example thermal interface device of FIG. 5.
Figure 9:
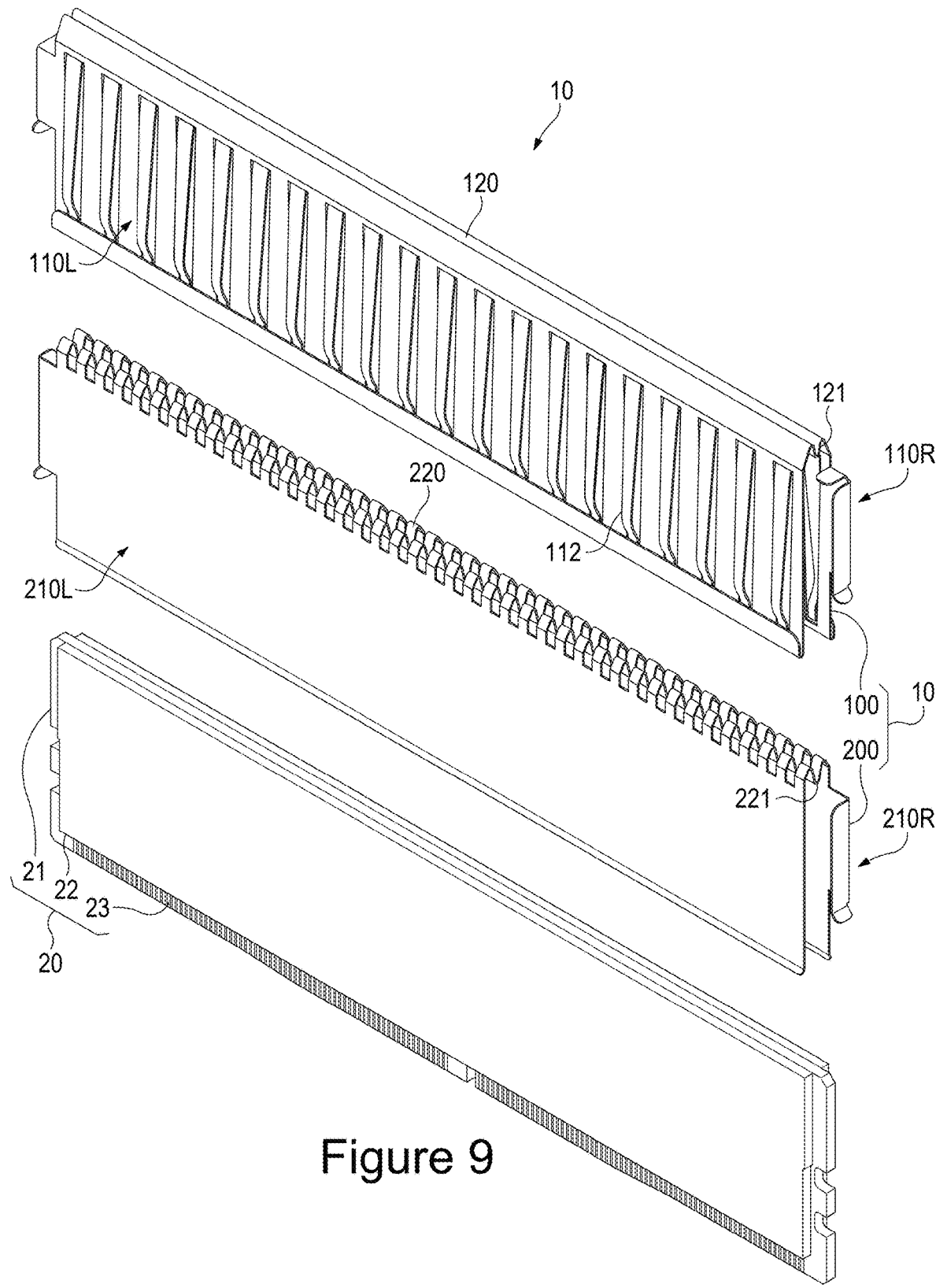
FIG. 9 illustrates an exploded perspective view of the example thermal interface device of FIG. 5.

The interface device 10 includes an outer part 100 and an inner part 200 (see FIGS. 4 and 9). The outer part 100 is formed from a thermally conductive and resilient material (e.g., a resilient metal like hard tempered copper), while the inner part 200 is formed from a thermally conductive and malleable metal (e.g., annealed soft copper). Both the outer part 200 and the inner part 100 are roughly clam-shell shaped; that is, they both have a pair of side segments (outer side segments 110 or inner side segments 210) that face one another and are connected together by a top segment (outer top segment 120 or inner top segment 220), so as to have a roughly U-shaped cross-section (see FIGS. 2, 4, 6, and 9). When installed, the inner part 200 is nested within the outer part 100, with a memory module 20 located between the inner side segments 210L/R (see FIGS. 1-9).

1.1 Outer Part 100

As noted above, the outer part 100 includes two outer side segments 110, which may be labeled 110L and 110R when it is desired to distinguish between them (see FIGS. 2, 4, 6, and 9). The outer side segments 110 are connected together by the outer top segment 120, so that the outer side segments 110 face one another (roughly parallel) with a gap therebetween. Each of the outer side segments 110 includes a planar portion 111 and multiple spring fingers 112 extending outward from the planar portion 111 (see FIGS. 1-3, 5, 6, and 8). The outer side segments 110 may be sized so as to cover all of the memory chips 22 of the memory module 20.

The spring fingers 112 may be arranged in one or more rows, with the spring fingers 112 in each row being roughly aligned along a line (see FIGS. 3 and 8). In the example of FIGS. 1-4, there are two rows of spring fingers (see FIG. 3), while in the example of FIGS. 5-9 there is just one row of spring fingers (see FIG. 8). In some examples, the spring fingers 112 may be distributed evenly along a length of the outer side segment 110 to facilitate even heat removal from the memory module 20. In some examples, the center-to-center distance between adjacent spring fingers 112 may be around 2 mm to 8 mm.

The spring fingers 112 may have any shape that enables them to be displaced (compressed) by the thermal transfer device when installed in a computing system, and to act as a spring by generating a restoring spring force in response to such displacement (compression). For example, the spring fingers 112 may include a top portion 114 that extends outward away from the planar portion 111 at an angle, a contact portion 113 that is to contact the thermal transfer device, and a bottom portion 115 that extends inward from the contact surface 113 and contacts the inner side segment 110 when the spring finger 112 is compressed (see FIGS. 2 and 6). In these examples, displacing (compressing) the spring fingers 112 by pushing inward on the contact portion 113 causes the bottom portion 115 and the top portion 114 to flex and causes the top portion to rotate relative to the planar portion 111, and elastic resistance of the material to these deformations results in a restoring spring force pushing the contact portion 113 outward. In addition, the displacing (compressing) of the spring fingers 112 may press the bottom portions 115 against the inner part 200, which may apply force on the inner part 200 towards the memory module 20, thereby helping the inner part 200 maintain good thermal contact with the memory module 20.

Although the spring fingers 112 are illustrated in the figures as having all of their sides being separate (e.g., cut) from the planar portion except for one side that is connected to the planar portion, this is merely one example and other examples could differ. For example, the spring fingers 112 may be surface extensions from the planar portion which, may be connected to the planar portion on more than one side or even all sides.

In the example of FIG. 1-4, the contact portion 113 is roughly parallel to a surface of the planar portion 111, while in the example of FIGS. 5-9 the contact portion 113 is angled. Having the contact portion 113 be parallel to the surface of the planar portion 111 may enable the contact portion to be flush with a surface of the thermal transfer device when they contact one another, which may improve a thermal interface between them. Having the contact portion 113 be angled relative to the planar portion 111 may make it easier to install the thermal transfer devices between the memory modules, as the thermal transfer devices may be able to slide more easily down the angled surface of the top portion 114 and the contact portion 113.

The spring fingers 112 may be any desired size. For example, in FIGS. 1-4 the spring fingers extend vertically a relatively short distance and are relatively narrower, while in FIGS. 5-9 the spring fingers 112 extend vertically almost an entire vertical height of the interface device 10 and are wider.

As noted above, the side segments 110 are connected together at top ends thereof by a top segment 120 (see FIGS. 1, 2, 5, and 6). In some examples, the top segment 120 is rounded (see FIGS. 1 and 2) or flat (not illustrated). In other examples, the top segment 120 includes one or more folds 121 (see FIGS. 6 and 10B). The folds 121 may enable the width of the outer part 100 (i.e., the distance between the two side segments 110) to be changed by bending the folds 121 to accommodate different widths of memory modules 20. For example, the folds 121 may exhibit springiness (elastic displaceability) allowing them to automatically expand/contract depending on the thickness of the memory module 20.

In some examples, the top segment 120 may be a different material than a material of the side segments 100. For example, the top segment may be an elastomer or similar material that is more flexible than the material of the side segments 100.

In some examples, the outer top segment 120 may include sections 122 in which material has been removed, resulting in a number of tabs 123 that connect one side to the other (see FIG. 8). These sections 122 of removed material may make it easier to bend the folds 121 of the top segment 120 to change the width of the outer part 100.

Figure 10A:
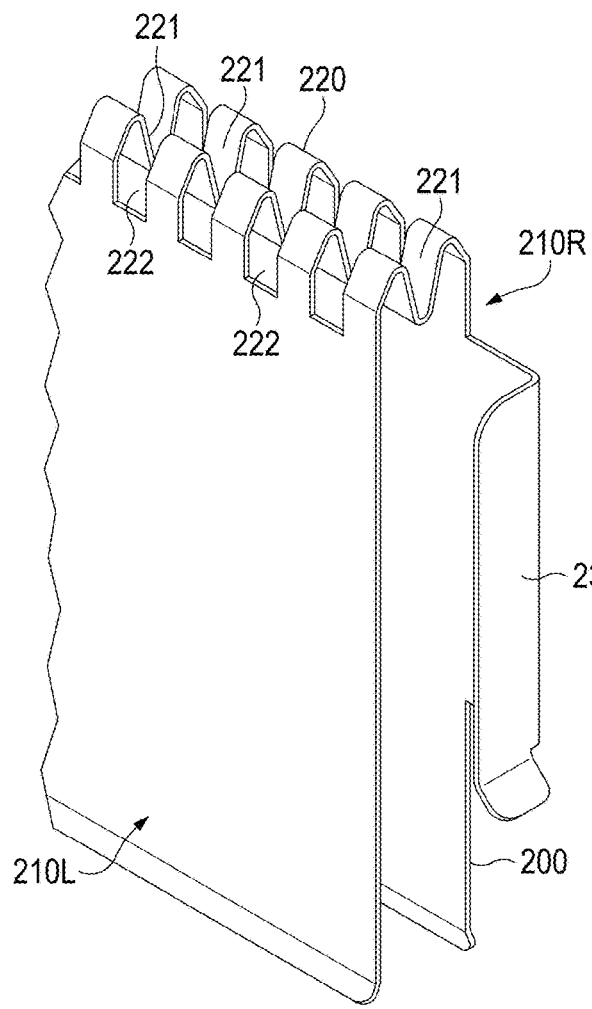
FIG. 10A illustrates a perspective view of a portion of an inner part of the example thermal interface device of FIG. 5.
Figure 10B:
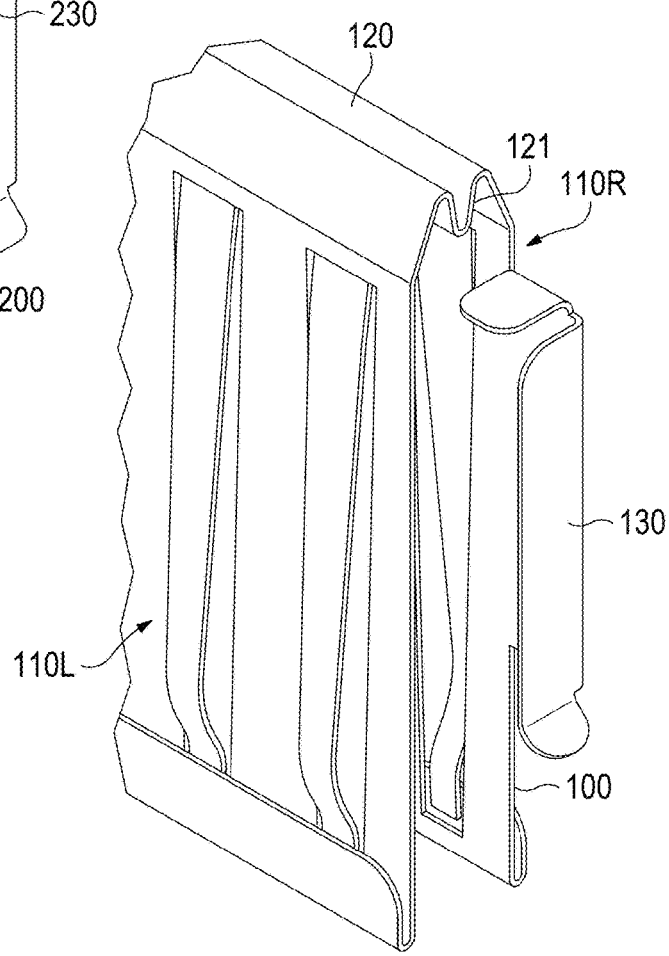
FIG. 10B illustrates a perspective view of a portion of an outer part of the example thermal interface device of FIG. 5.

In some examples, the outer part 100 may include end guide features 130, which extend over the two short ends of the memory module 20 to help hold the interface device 10 on the memory module 20 (see FIGS. 8 and 10B). For example, each side segment 110 may include one end feature 130 that to extend over one of the short ends of the memory module 20 (see FIGS. 8 and 10B).

Figure 6:
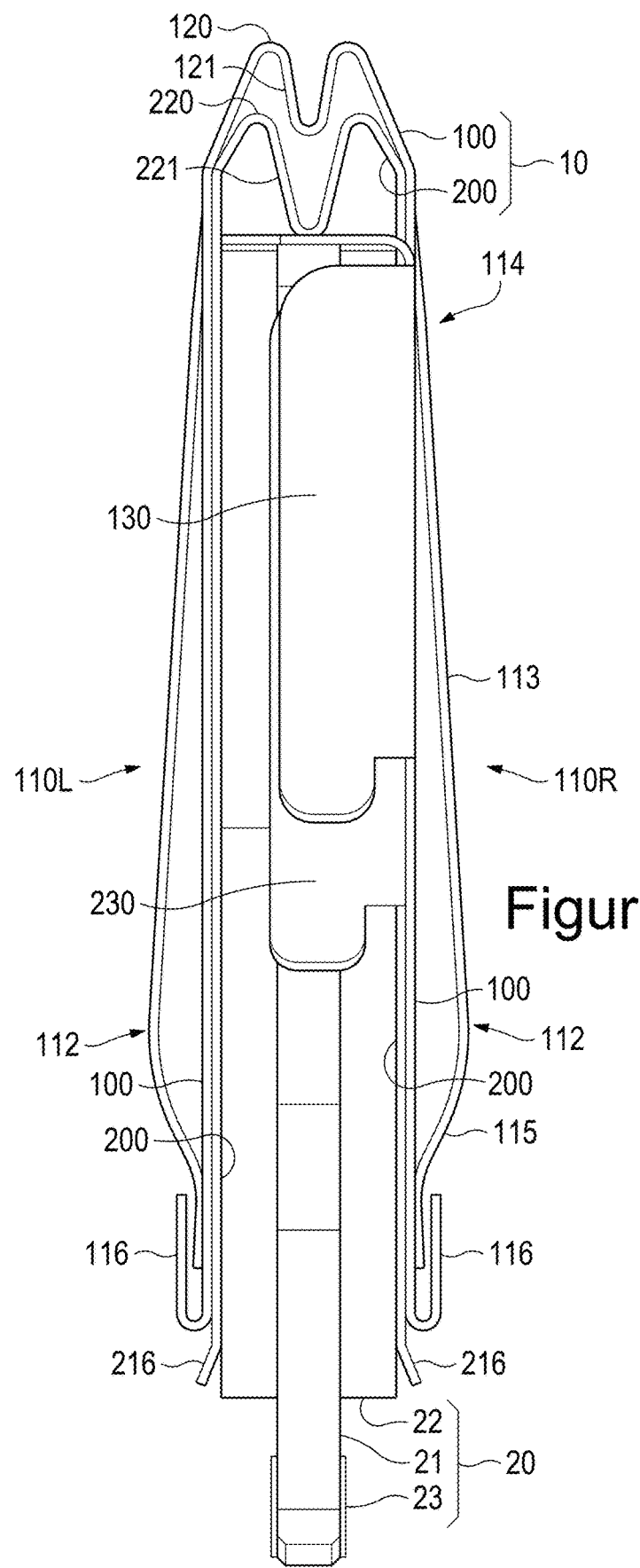
FIG. 6 illustrates a front plan view of the example thermal interface device of FIG. 5.
Figure 7:
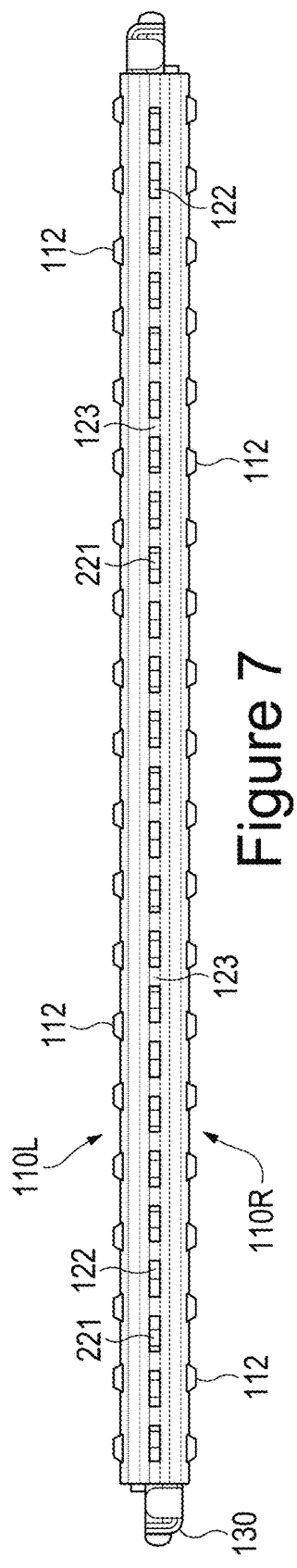
FIG. 7 illustrates a top plan view of the example thermal interface device of FIG. 5.

In some examples, the outer side segment 110 may include a spring protector 116 to cover bottom ends of the spring fingers 112 (see FIG. 6). The spring protector 116 may be formed by folding over a bottom edge of the outer side segment 110 to cover the bottom ends of the spring fingers 112, thereby protecting the ends of the spring fingers 112.

In some examples, the outer part 100 is formed from a single continuous piece of thermally conductive, resilient, material. For example, the outer part 100 may be formed from a single piece of sheet metal that is worked (e.g., bent, cut, stamped, etc.) to form the two side segments 110 connected by the top segment 120, and to form the spring fingers 112. For example, the outer part 100 may be formed from a hard tempered copper, hard tempered aluminum, beryllium copper, brass, a metal enhanced with a graphite liner, steel etc. In some examples, the outer part 100 may be formed from a resilient thermally conductive plastic. In some examples, the planar portions 111 of the outer side segments 110 may be between 0.10 mm and 0.50 mm thick.

1.2 The Inner Part 200

As noted above, the inner part 200 includes two inner side segments 210, which may be labeled 210L and 210R when it is desired to distinguish between them (see FIGS. 2, 4, 6, and 9). The inner side segments 210 are connected together by the inner top portion 220, so that the inner side segments 210 face one another (roughly parallel) with a gap therebetween. The inner side segments 210 are planar, and may be sized so as to cover all of the memory chips 22 of the memory module 20 (see FIGS. 2, 4, 6, and 9).

In some examples, the inner top segment 220 is rounded (see FIGS. 1 and 2) or flat (not illustrated). In other examples, the top segment 220 includes one or more folds 221 (see FIGS. 6 and 10A). The folds 121 may enable the width of the inner part 200 (i.e., the distance between the two side segments 210) to be changed by bending the folds 221 to accommodate different widths of memory modules 20.

In some examples, the top segment 220 may include sections 222 in which material has been removed, resulting in a number of tabs 223 that connect one side to the other (see FIG. 10A). These sections 222 of removed material may make it easier to bend the folds 221 to change the width of the inner part 200.

In some examples, the inner part 200 may include end guide features 230, which extend over the two short ends of the memory module 20 to help hold the interface device 10 on the memory module 20 (see FIGS. 8 and 10A). For example, each side segment 210 may include one end feature 230 that to extend over one of the short ends of the memory module 20 (see FIGS. 8 and 10A). The end guide features 230 may be nested within and covered by the end guide features 130 when the inner part 200 is nested within the outer part 100.

In some examples, the inner part 200 is formed from a single continuous piece of thermally conductive, malleable, material. In some examples, the material is a malleable metal like annealed (soft) copper, annealed (soft) aluminum, magnesium, etc. In some examples, the material may be a thin sheet of malleable and thermally conductive plastic. For example, the inner part 200 may be formed from a single piece of sheet metal that is worked (e.g., bent, cut, stamped, etc.) to form the two side segments 210 connected by the top segment 220. In some examples, the inner side segments 210 may be between 0.05 mm and 0.50 mm thick.

In some examples, the inner part 200 may differ from a thermal interface material (TIM) in a number of ways. For example, the inner part 200 is a solid body that is comparatively more rigid, stronger, and harder than conventional TIMs such as gap pads and thermal greases/pastes. This may enable the material forming the inner part 200 to be formed into and retain its intended shape in a way that conventional TIMs could not. Moreover, this may enable the inner part 200 to provide structural support to the interface device 10, so that the outer layer 200 does not have to provide all of the structural support and thus can be made thinner. This may also enable the inner layer 200 to protect the memory module 20 from damage in a way that a conventional TIM might not be able to. The inner part 200 is also much thinner than a thermal gap pad, which allows the memory modules 200 to be spaced together more closely, which is particularly desirable in dense systems such as systems with twinned-board configurations. The inner part 200 is also less susceptible than a gap pad to being damaged during installation, and does not run, spill, migrate into surfaces, and require reapplication whenever the interface devices 10 is removed as thermal paste/grease might. In sum, the inner part 200 is quite different from, and should not be confused with, a conventional TIM.

In some examples, the inner part 200 has a layer 211 that is adhered to its inward facing surfaces, especially the inward facing surfaces of the side segments 210. This layer 211 is electrically insulating, and may be included to prevent shorting or other electrical issues when the inner part 200 contacts the memory chips 22 of the memory module 20. The layer 211 should also be thermally conductive in its thickness dimension (the direction from memory module 20 to the inner part 200). In some examples, thermal conductivity of the layer 211 in the thickness dimension may be achieved even with materials that are poor thermal conductors in bulk by ensuring that the layer 211 is sufficiently thin. In particular, in some examples it may be desirable for the layer 211 to be as thin as possible while still maintaining electrical insulation. In some examples, the layer 211 has a dielectric strength of at least 1000 V/mil ($3.94 \times 10^7$ V/m). In some examples, the electrically insulating layer 211 is between 0.0045 mm and 0.13 mm thick. In some examples, the electrically insulation layer 211 is less than 0.0254 mm thick. The electrically insulating layer 211 may be formed from, for example: Glass, Kapton, Thermoplastics, Electrical insulating papers, tapes, and foams, Neoprene, Polystyrene, Kynar, Lexan, Merlon, Acetate, Acrylic, Polyolefins, Polystyrene, Polyurethane, PVC (Polyvinylchloride), Silicone, Fiberglass, Melamine, Mica, Nomex, Nylon, Vinyl, Laminates, E.T. (Polyethylene terephthalate), Phenolics, Beryllium oxide, Ceramic, Delrin, Epoxy, Polyester (Mylar), TFE (Teflon). In some examples, the layer 211 is applied to the inner part 200 as a powder coating after the inner part 200 is fabricated. In some examples, the layer 211 is an insulation layer such as polyester that is bonded to the material (e.g., sheet metal) that will become the inner part 200 before the inner part is fabricated.

1.3 Example Computing Systems

The interface device 10 is designed to be installed on a memory module 20 of a computing system 400 such that the spring fingers 112 of the interface device 10 contact and are displaced (compressed) by a thermal transfer device 430 that is located on a side of the memory module 20 (see FIGS. 11-15).

More specifically, in example computing systems 400, memory modules 20 may be installed in memory sockets 420 of a printed circuit assembly (PCA) 410, which may also be called a printed circuit board (PCB), a system board, a motherboard, a node, a node board, a circuit board, etc. (see FIGS. 11-15). Each of the memory modules 20 may include a board 21, memory chips 22 on the board 21, and an edge connector 23 to connect into the memory sockets 420 (see FIGS. 2-4).

In the example computing system 400, each of the memory modules 20 may have one of the interface devices 10 installed thereon (see FIGS. 11-15). The interface device 10 may be installed on a memory module 20 by, for example, nesting the inner part 200 within the outer part 100 (if it is not already so assembled), positioning the bottom of the interface device 10 on the top of the memory module 20 with the memory module 20 aligned with the gap between the inner side segments 220, and then sliding the interface device 10 downward onto the memory module 20. When installed, the inner side segments 220 are in contact with opposite sides of the memory module 20; specifically, the inner side segments 220 are in contact with each of the memory chips 22 of the module 20 (see FIGS. 2, 6).

In some examples, at least one thermal transfer device 430 is provided for each memory module 20 to cool the module 20 (see FIGS. 11-15). In particular, in some examples, for each interface device 10, there is provided one thermal transfer device 430 for each row of spring fingers 112 on the interface device 10 (see FIGS. 11-15). Each thermal transfer device 430 may contact and compress some of the spring fingers 112 (e.g., one row of spring fingers 112) of the interface device 10 that is installed on its corresponding memory module 20 (see FIGS. 11-15).

In some examples, thermal transfer devices 430 may be interleaved between the memory modules 20. This may include the thermal transfer devices 430 being interleaved between the memory modules 20 of one PCA 410, as in FIGS. 11 and 12, or the thermal transfer devices 430 being interleaved between the interdigitated memory modules 20 of two PCAs 410 in a twinned-board configuration (described in greater detail below), as in FIG. 13-15. In some examples, each thermal transfer device 430 that is located between two adjacent memory modules 20 is in contact with spring fingers 112 of both of the memory modules (see FIGS. 11-15).

The thermal transfer devices 430 may be any type of thermal transfer device (see definition below). In some examples, the thermal transfer devices 430 are heat pipes (see definition below). In some examples, as in FIGS. 11-15, the thermal transfer devices 430 have flat sides (e.g., they may be flattened heat pipes), which provides more surface area to contact the spring fingers 112, thereby improving the thermal interface.

Figure 13:
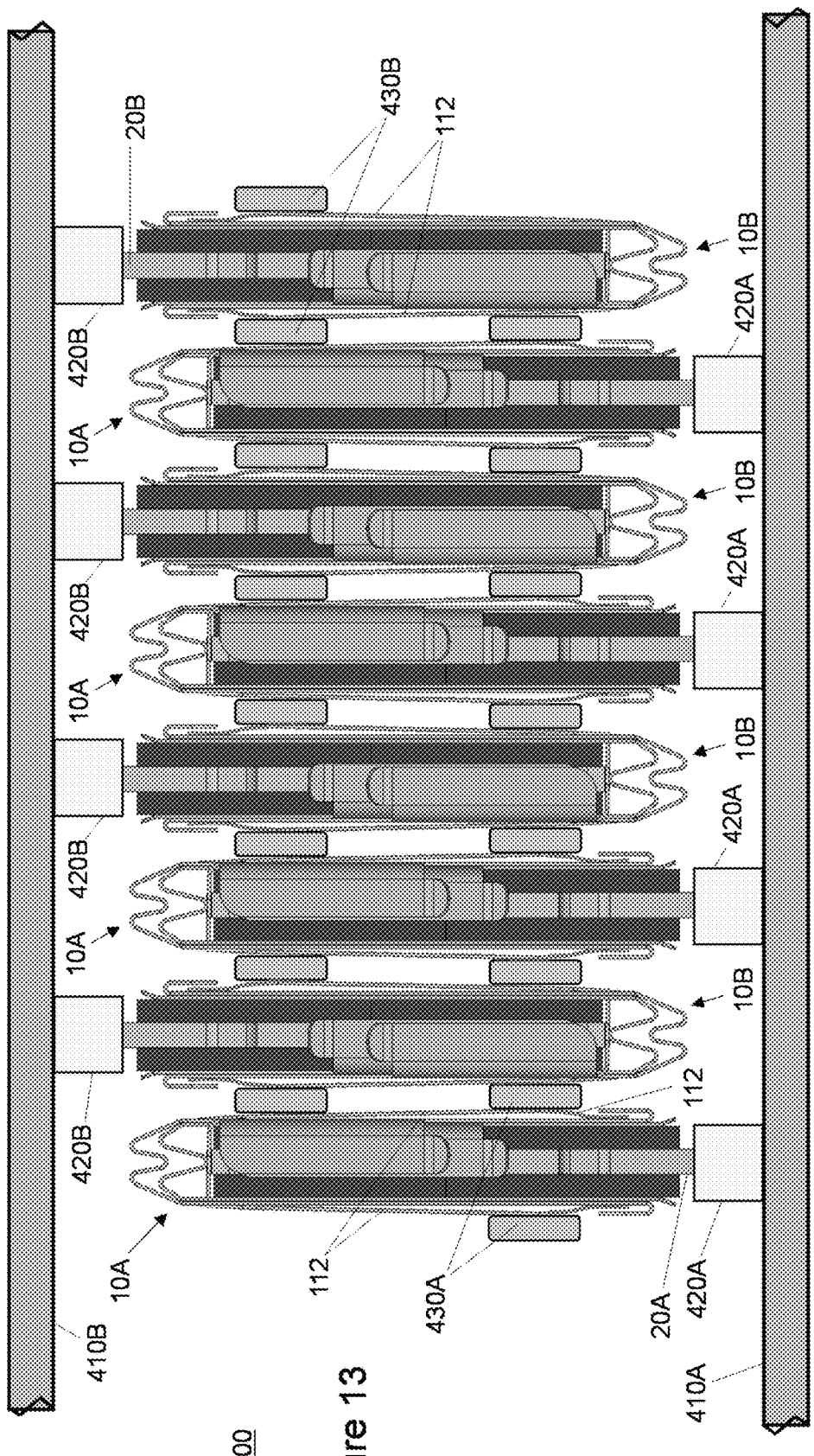
FIG. 13 illustrates an example computing device with a twinned-board configuration that includes the example interface device of FIG. 5.
Figure 14:
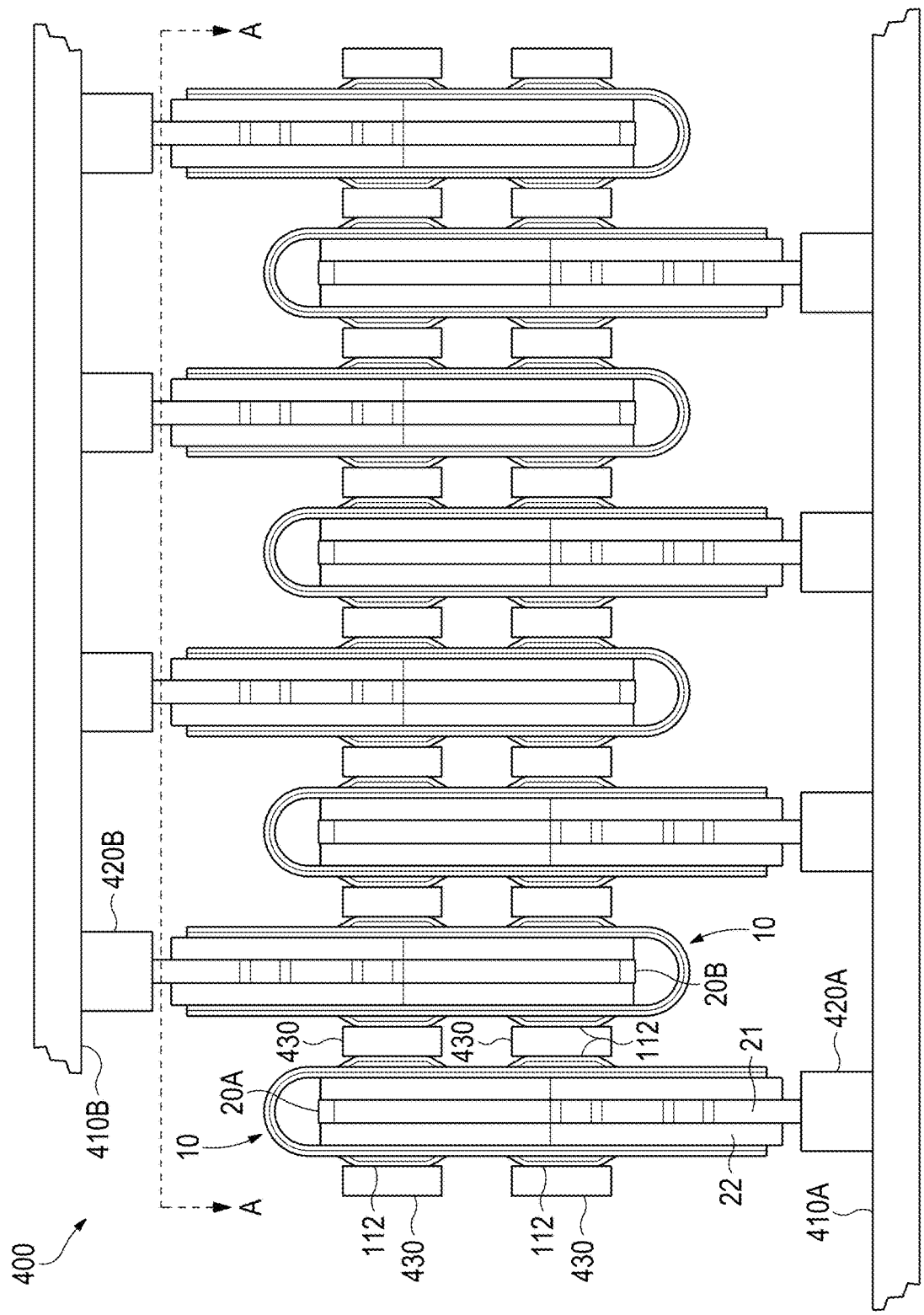
FIG. 14 illustrates an example computing device with a twinned-board configuration that includes the example interface device of FIG. 1.

In some examples, the computing system 400 may have a twinned-board configuration, in which the computing system 400 has two PCAs 410 that are arranged with a top side (i.e., the side with the memory sockets 420) of one the PCAs 410 facing the top side of the other PCA 410 such that the memory modules 20 of the two PCAs 410 are interdigitated (see FIGS. 13-14).

For example, a system 400 in a twinned-board configuration may be assembled in the following manner. First, the memory modules 20 and the interface devices 10 may be installed in the PCAs 410 while the PCAs 410 are still separate. Second, a first subset of thermal transfer devices 430 may be installed between the memory modules 20 of one board 410A by sliding the thermal transfer devices 430 down between and around the memory modules 20, resulting in the thermal transfer devices 430 engaging spring fingers 112 of the interface devices 10, and then securing the first subset of thermal transfer devices 430 to the board 410A. A second subset of thermal transfer devices 430 may be installed on the other board 410B in the same manner. Third, one of the PCAs 410B (with the memory modules 20, interface devices 10, and subset of thermal devices 430 installed thereon) may be turned over, positioned above the other PCA 410A, and lowered down such that the memory modules 20 of the two PCAs 410 are interdigitated. As the PCA 410A and 410B are assembled in this manner, the interface devices 10 of the PCA 410B will slide into position between the thermal transfer devices 430 of the other PCA 410A, and vice versa.

Alternatively, a system 400 in a twinned-board configuration may be assembled in the following manner. First, a first subset of thermal transfer devices 430 may be installed one board 410A and a second subset of thermal transfer devices 430 may be installed on the other board 410B. Next, the memory modules 20 with the interface devices 10 attached thereto may be installed in both of the PCAs 410 by sliding the memory modules 20 down between adjacent thermal transfer devices 430, resulting in the thermal transfer devices 430 engaging spring fingers 112 of the interface devices 10. Finally, one of the PCAs 410B (with the memory modules 20, interface devices 10, and subset of thermal devices 430 installed thereon) may be turned over, positioned above the other PCA 410A, and lowered down such that the memory modules 20 of the two PCAs 410 are interdigitated.

In some examples, once the two PCAs 410 are assembled, the thermal transfer devices 430 of one PCA 410 (e.g., PCA 410A) contact not only the interface devices 10 of that PCA 410, but also the interface devices 10 of the other PCA 410 (e.g., PCA 410B) (see FIG. 14).

In some examples, the two PCAs 410 in a twinned board configuration may be housed within and/or supported by a same server chassis or server tray. The twinned-board configuration may be advantageous in some circumstances, as it may reduce an amount of space that would otherwise be required for the PCAs 410, and may also enable the sharing of certain resources (like liquid coolant loops).

Each thermal transfer device 430 may be thermally coupled with a heat removal system that dissipates heat generated by the memory modules 20 into a cooling medium. The heat removal system may include a heat sink (not illustrated) or a liquid cooled cold plate 440 (see FIGS. 12 and 15). In some examples, all of the thermal transfer devices 430 are coupled to the same heat sink or cold plate 440. In other examples there may be multiple heat sinks and/or cold plate 440 and some thermal transfer devices 430 may be connected to different heat sinks or cold plates 440 than others.

For example, in an example system 400 with a twinned-board configuration, subsets of the thermal transfer devices 430 board may be associated with the boards 410, respectively, and each board 410 may have its own cold plate 440 to which its associated thermal transfer devices 430 are coupled. Herein and in the figures, the particular PCA 410 that a thermal transfer device 430 is associated with may occasionally be indicated by appending the label "A" or "B" (e.g., a thermal transfer device 430A is associated with the PCA 410A). In some examples, thermal transfer devices 430 may be secured to the board they are associated with, such that thermal transfer devices 430A are secured to the PCA 410A and thermal transfer device 430B are secured to the PCA 410B.

Figure 12:
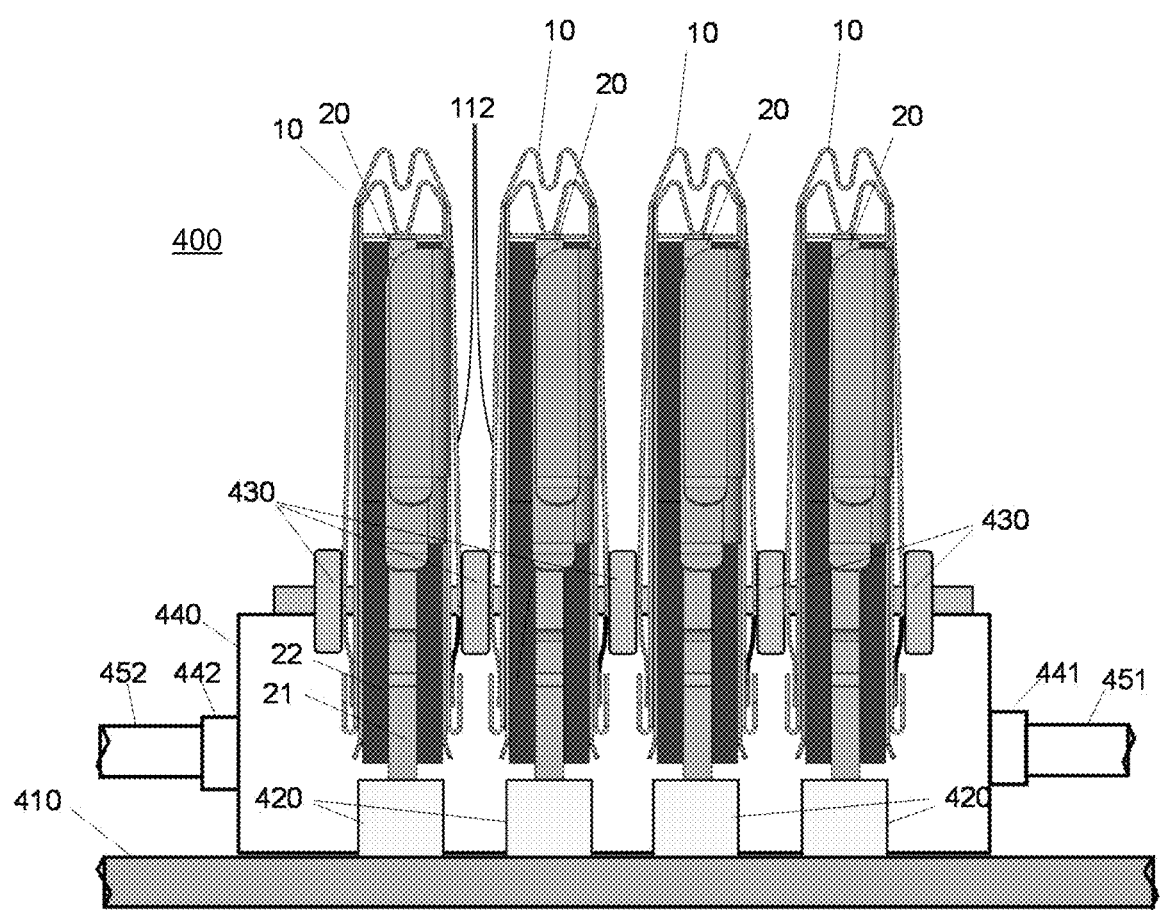
FIG. 12 illustrates an example computing device that includes the example interface device of FIG. 5.
Figure 15:
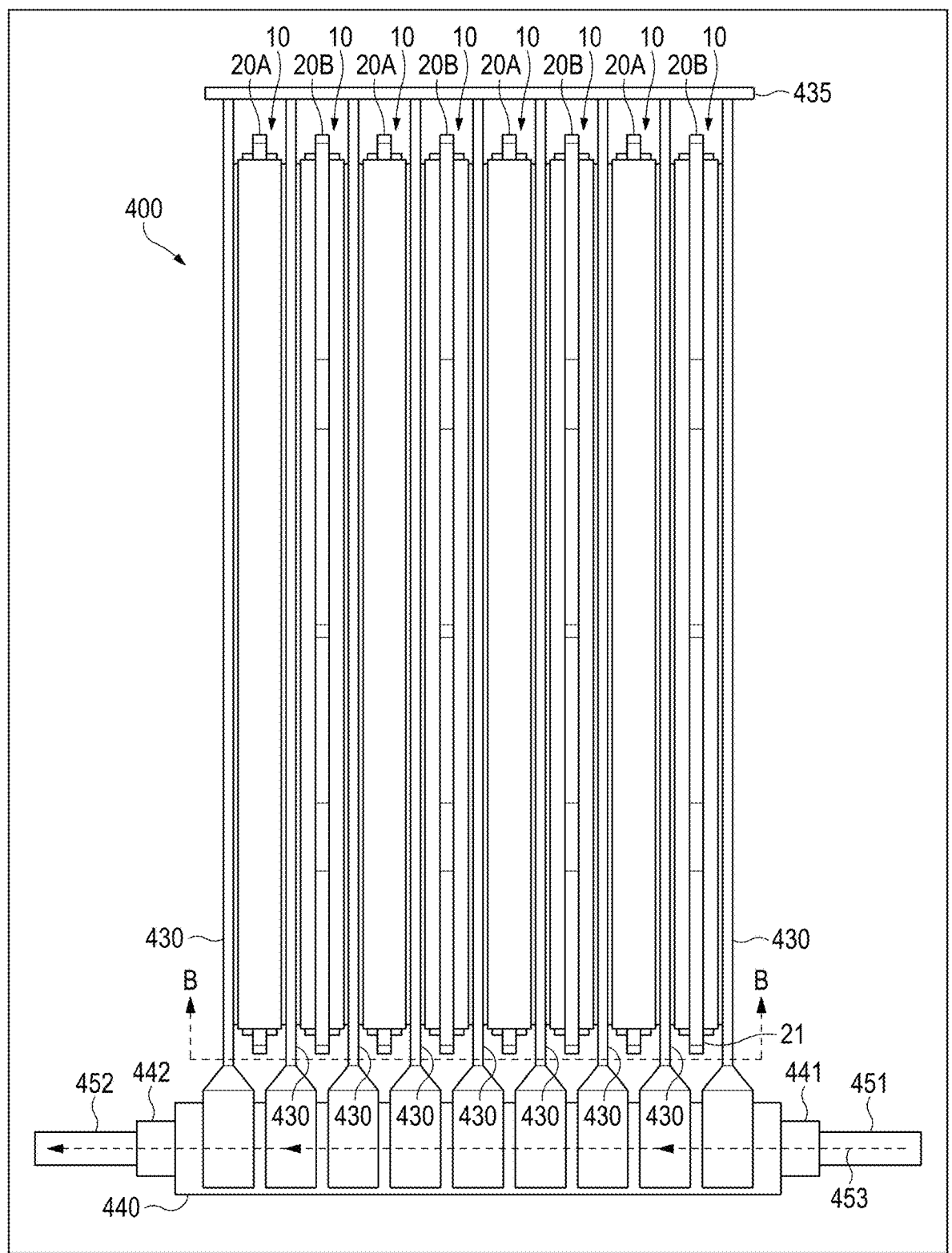
FIG. 15 illustrates cross-sectional view of the example computing device of claim 14, with the section taken along the line A-A.

The thermal transfer device 430 may be directly connected to the heat sink or cold plate 440, as illustrated in FIGS. 12 and 15, or the thermal transfer device 430 could be thermally coupled to the heat sink or cold plate 440 via another thermal transfer device (or a chain of such devices). In FIGS. 12 and 15, the thermal transfer devices 430 are flattened at their ends to improve their thermal interface with the cold plate 440, with the flat surfaces at the ends of the thermal transfer devices 430 being perpendicular to the flat surfaces of the thermal transfer devices 430 between the memory modules 20.

In FIGS. 12 and 15, the cold plate 440 is shown immediately adjacent to the memory sockets 420 and as having a particular shape and dimensions, but this is merely one example, and the cold plate could be located elsewhere and have a different shape and different dimensions. For example, the thermal transfer devices 430 could bend/turn when they are outside of the region between the memory modules 20 to allow them to couple to a cold plate 440 or a heat sink located in any arbitrary location. Cold plates 440 and/or heat sinks are not illustrated in FIGS. 11, 13, and 14 to simplify the illustrations, but it should be understood that in any of these examples the thermal transfer devices 430 can be coupled to one or more a heat sinks or cold plates 440. In FIG. 15, the cold plate 440 and support 435 of the top board 410B are not illustrated to avoid obscuring the image.

The liquid cooled cold plate 440 may be connected to a liquid supply line 451 via a connector 441 and to a liquid return line 452 via a connector 442, and may include an interior channel running between the connectors 441 and 442 (see FIGS. 12 and 15). Thus, liquid coolant 453 supplied by the liquid supply line 451 may flow through the cold plate 440 to the liquid return line 452, as indicated by the dash-lined arrows in FIG. 15. The liquid supply line 451 and liquid return line 452 may be part of a cooling loop of a liquid cooling system, which may include additional components that are not illustrated, such as pumps, heat exchangers, chillers, etc. In other examples (not illustrated), a liquid cooling line may be placed in thermal contact with the cold plate 440, rather than having the liquid flow through an interior channel of the cold plate 400. In either case, heat is transferred from the cold plate 440 into the liquid coolant, which removes the heat from the computing system. Examples in which the thermal transfer devices 430 are coupled with a liquid cooled cold plate 440 may be particularly advantageous in computing systems 400 that are designed to have no air flowing therethrough.

In some examples, the thermal transfer devices 430 may also be connected to a support structure 435 (See FIG. 15). The support structure 435 may support the thermal transfer device 430, and may affix them to the PCA 410. In some examples that use a twinned-board configuration, each of PCAs 410A/B may have its own support structure 435 to support the subset of thermal transfer device 430 that are associated with that board 410.

2.0 Second Example Thermal Interface Devices and Computing Systems

A second example memory thermal interface device 1000 ("interface device 1000") will now be described with reference to FIGS. 16-26. Because certain features are visible in many of the figures, to avoid duplicative description the figures will not be described separately. Instead, each feature will be described, and certain figures that are relevant to that feature will be identified parenthetically.

The interface device 1000 is similar to the interface device 10 in that it includes an outer layer formed from a thermally conductive and resilient material and an inner layer formed from a thermally conductive and malleable metal. However, rather than the outer layer being a single part as in the interface device 10, in the interface device 1000 the outer layer comprises two separate outer parts 500R/L that are attached together during installation (see FIGS. 16, 19, and 24). Similarly, rather than the inner layer being a single part as in the interface device 10, in the interface device 1000 the inner layer comprises two separate inner parts 600R/L that are attached together during installation (see FIGS. 16, 22, and 24). When installed, the inner parts 600R/L are nested within the outer parts 500R/L, with a memory module 20 located between the inner parts 500R/L (see FIG. 24).

2.1 Outer Parts 500

Figure 16:
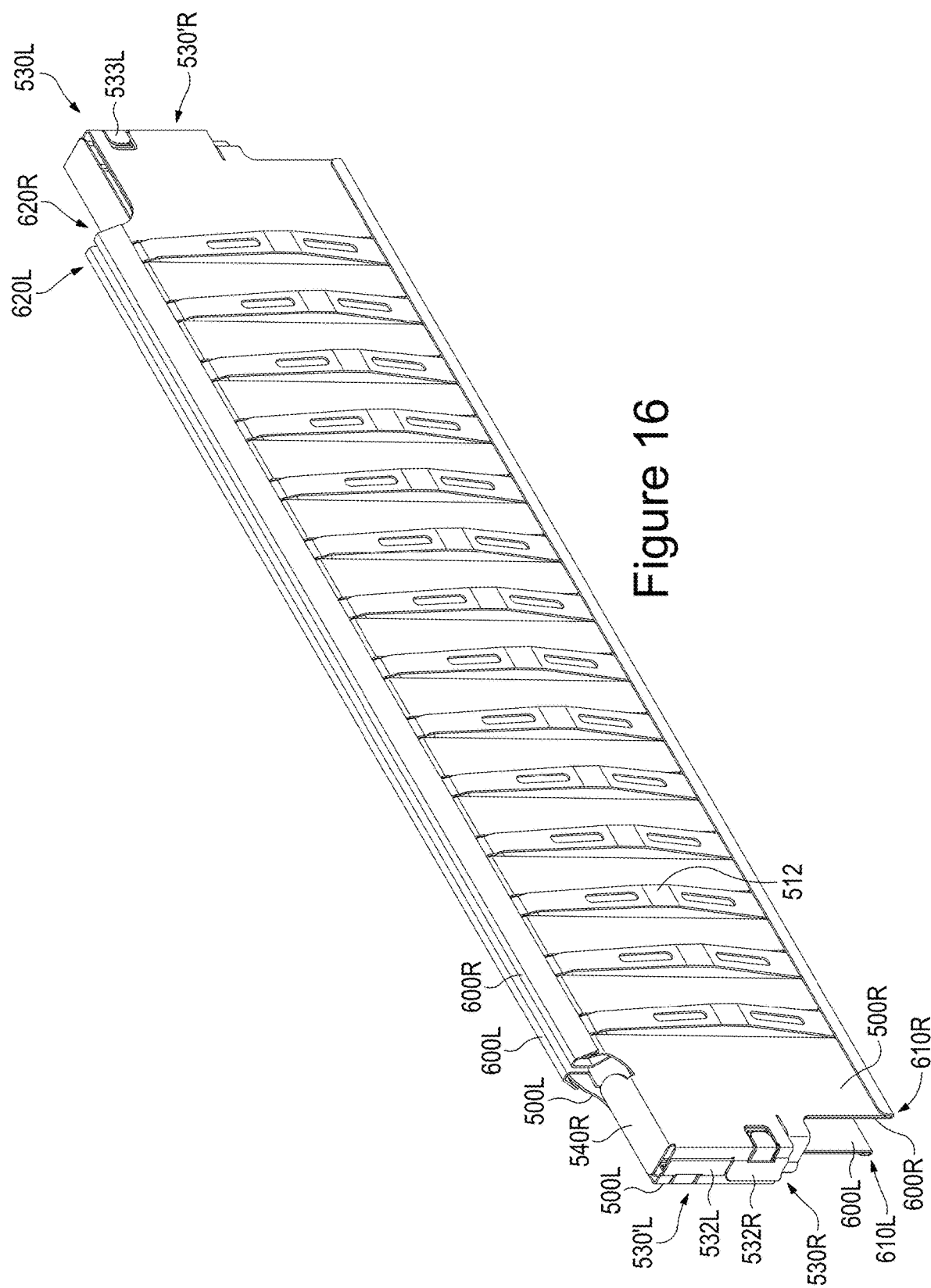
FIG. 16 illustrates a perspective view of an example thermal interface device.
Figure 19:
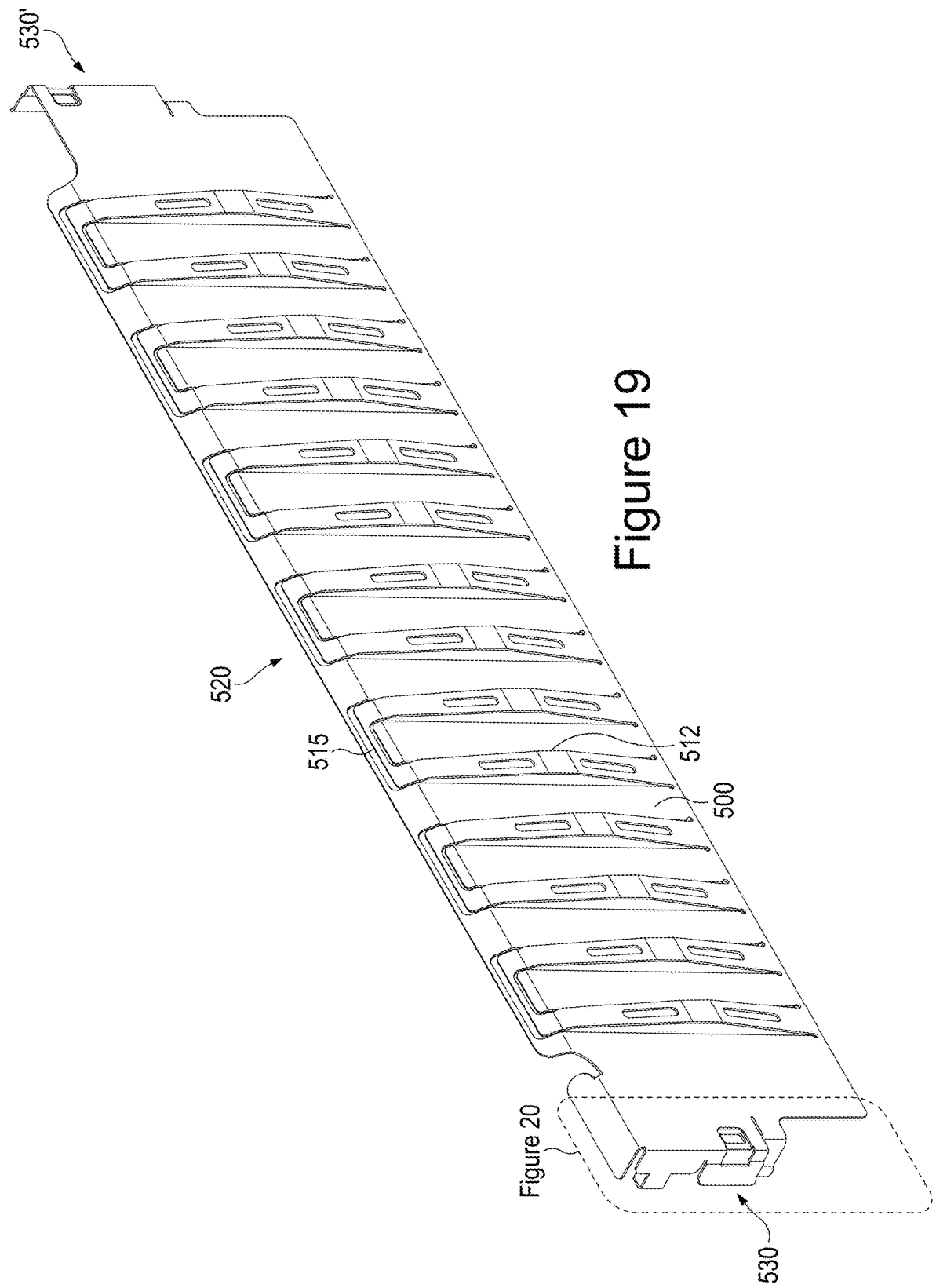
FIG. 19 illustrates a perspective view of an outer part of the example thermal interface device of FIG. 16.
Figure 20:
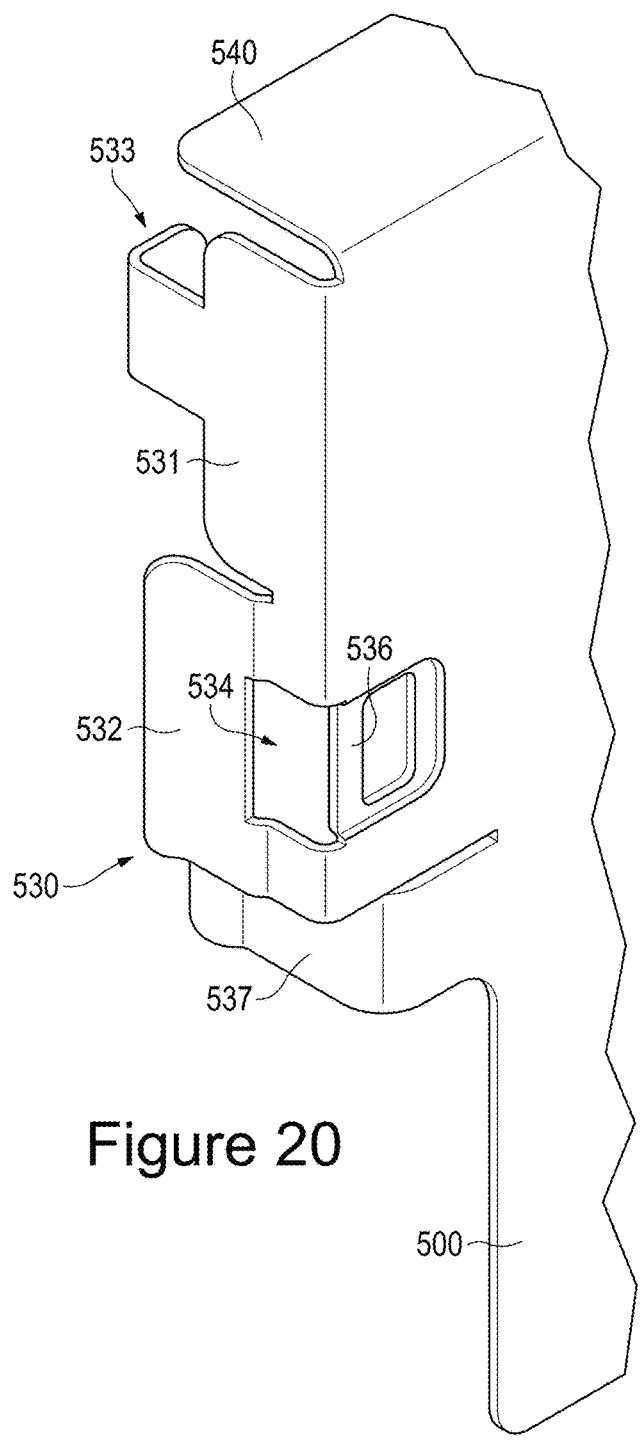
FIG. 20 illustrates a perspective view of a portion of an outer part of the example thermal interface device of FIG. 16.
Figure 21:
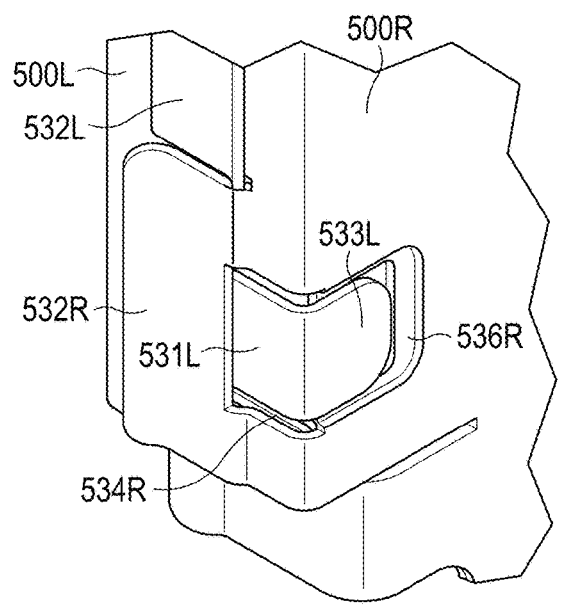
FIG. 21 illustrates a perspective view of a portion of the example thermal interface device of FIG. 16.
Figure 22:
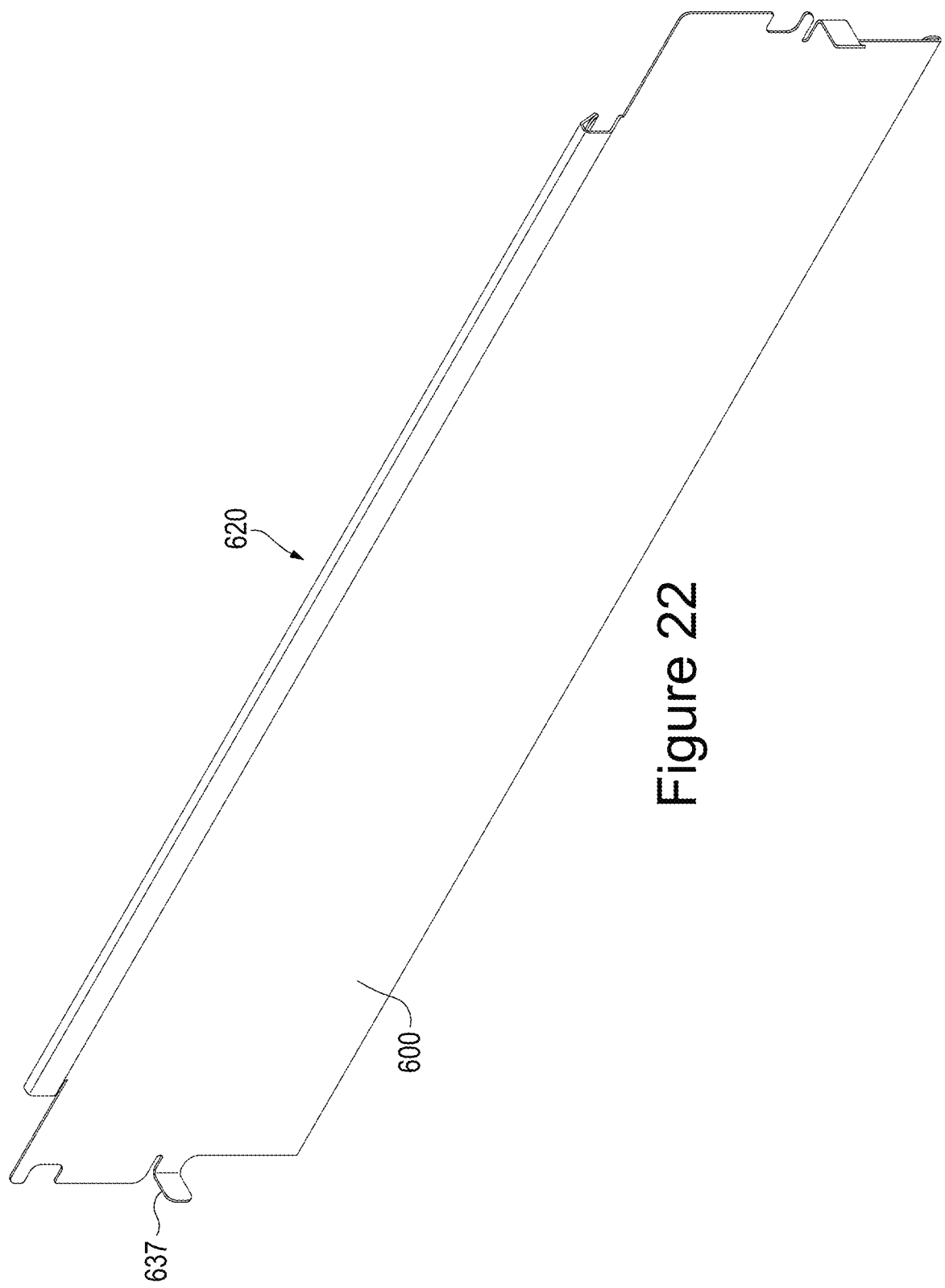
FIG. 22 illustrates a perspective view of an inner part of the example thermal interface device of FIG. 16.
Figure 23A:
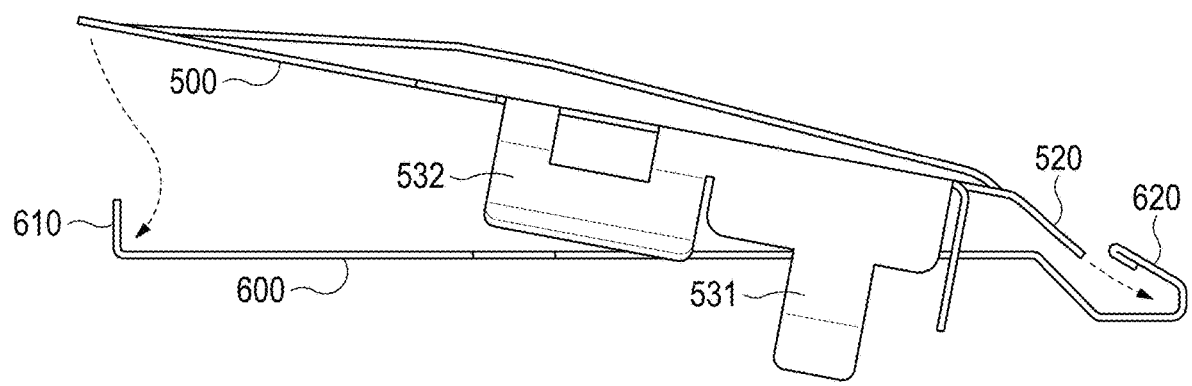
FIGS. 23A-23C illustrate a sequence of steps in assembling an inner part and an outer part of the example thermal interface device of FIG. 16 into an assembly.
Figure 23B:
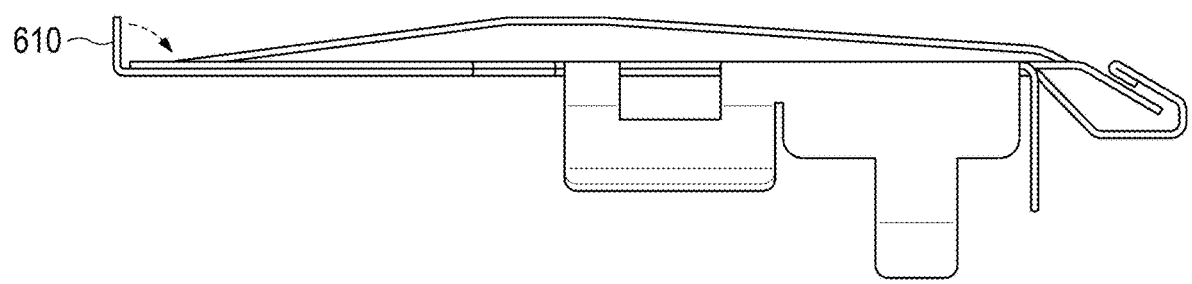
Figure 23C:
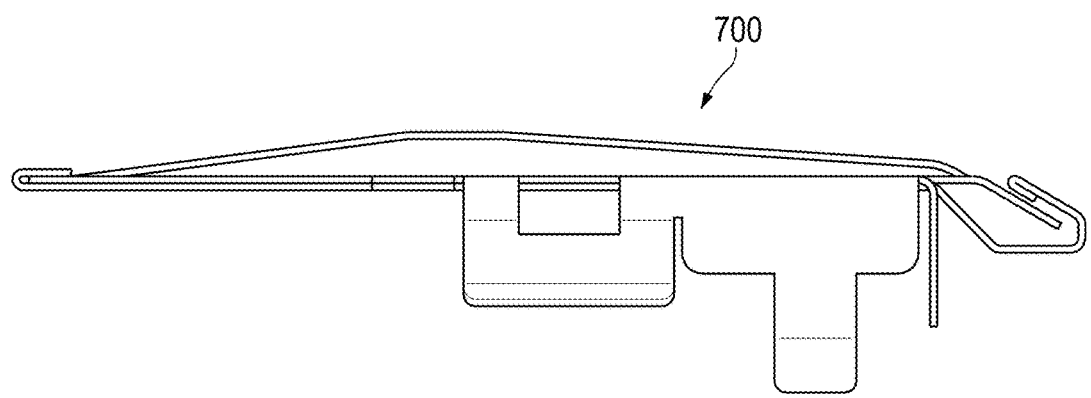

The outer parts 500 each include a main body and multiple spring fingers 512 extending outward from the main body (see FIGS. 16 and 19). The outer parts 500 are similar to the outer side segments 110 described above, and thus anything said above with respect to the outer side segments 110 is also applicable to the outer parts 500 unless it is indicated otherwise below or would be logically contradictory, and will not be repeated below to avoid duplicative description. The outer parts 500 may differ from the outer side segments 110 in that the outer parts 500 are separate pieces (they are not connected together via a top segment), and they include attachment features 530 and 530' to attach the outer parts 500 together during installation.

Figure 18:
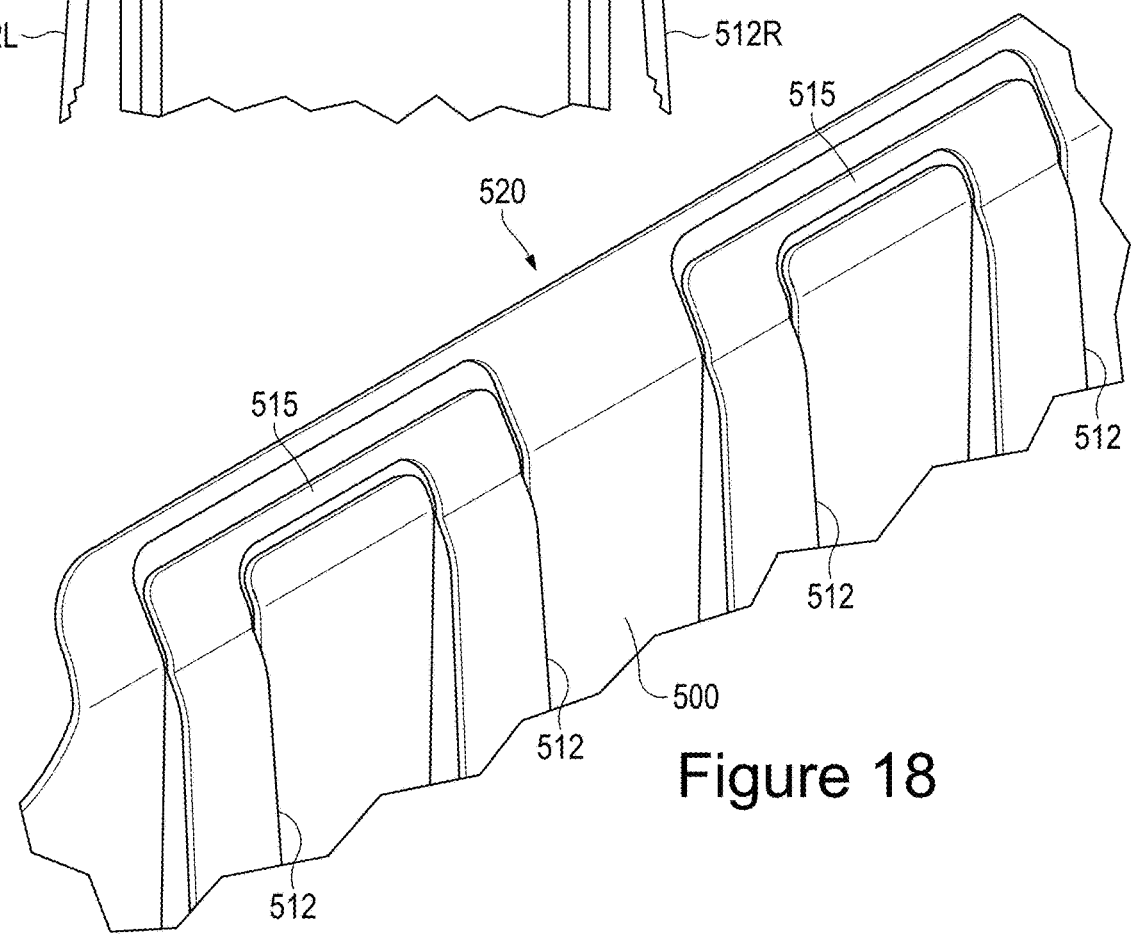
FIG. 18 illustrates a perspective view of a portion of an outer part of the example thermal interface device of FIG. 16.

In some examples, two or more the spring fingers 512 may be connected together at one end thereof, as illustrated in FIGS. 18 and 19.

Figure 17:
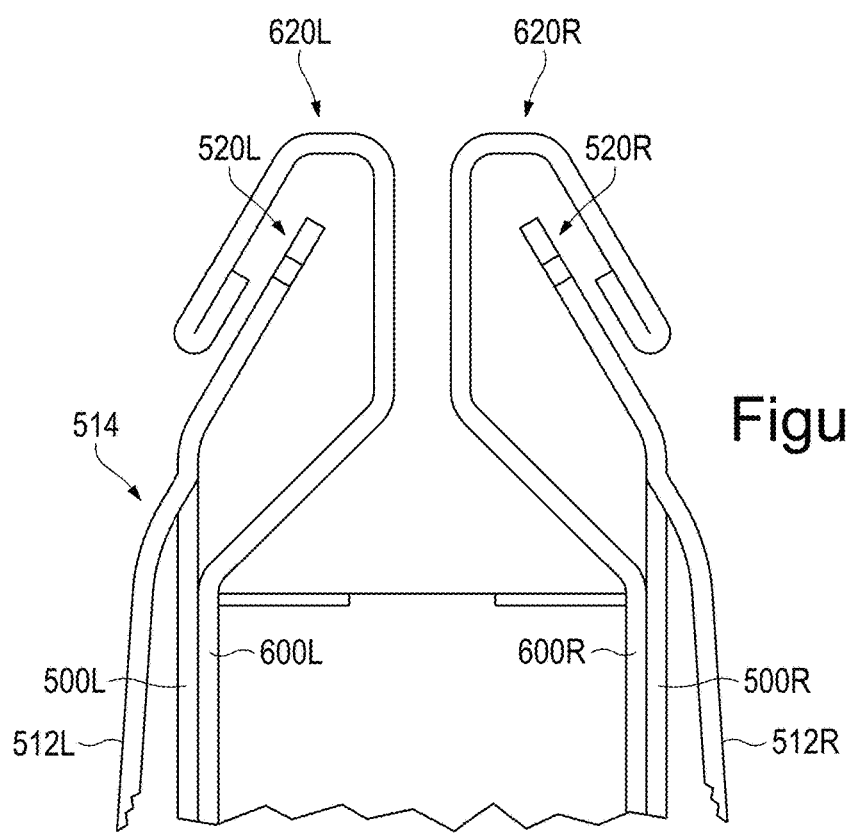
FIG. 17 illustrates a front plan view of a portion of the example thermal interface device of FIG. 16.

In some examples, a top region 520 of the outer parts 500 is bent/curved inward, and so as to be partially covered by a top portion 620 of the inner parts 600 (see FIGS. 17-19). In some examples, the spring fingers 512 extend into the top region 520 and are also curved inwardly, and are covered by a top portion 620 of the inner parts 600 (see FIGS. 17-19).

Each outer part 500 includes first attachment features 530 at one end and second attachment features 530' at the other end. The attachment features 530 and 530' extend inwardly from the main body of the outer part 500. The attachment features 530 and 530' are complementary to one another, meaning that they include features that located and shaped such that, when two outer parts 500 brought together, the features engage with (mate with) one another and thereby attach the two outer parts 500 together. For example, if the first attachment features 530 include a tab or latch, the second attachment features 530' may include a complementary receptacle that is shaped and located to engage with the tab or latch.

For example, in FIGS. 16-26, the first attachment features 530 include a tab 531, and the second attachment features 530' includes a corresponding receptacle 532 that is complementary to the tab 531. The tab 531 is located at the same vertical position on the outer part 500 as the corresponding receptacle 532, and thus when two outer parts 500 are brought together facing one another, the tab 531 of one outer part 500 is aligned with the receptacle 532 of the other outer part 500. In addition, the receptacle 532 is shaped to engage with (mate with) the tab 531 to attach the two parts 500 together. Specifically, when the tab 531 engages the receptacle 532, the tab 531 slides under a portion of the receptacle 532 and an end portion 533 of the tab 531 passes through an opening 534 of the receptacle 532, and then the end portion 533 is bent into a recess 536 in the outer part 500, thereby latching the two parts 500 together (see FIGS. 21 and 24). Note that in the FIGS. 19-21 the end portion 533 is shown in its bent state, but it prior to being bent it would be straight as shown in FIG. 24.

The first attachment features 530 may include multiple attachment features, and the second attachment features 530' may include corresponding complementary features. For example, in the example illustrated in FIGS. 16-26, the first and second attachment features 530, 530' both include the tab 531 and the receptacle 532 described above. In vertical locations of the tab 31 and receptacle 532 a swapped as between the first attachment features 530 and the second attachment features 530', to enable proper mating between the features. In other examples (not illustrated), the first attachment features 530 may have multiple tabs 31 and the second attachment features 530' may have multiple corresponding receptacles 532. Additional or alternative attachment features beyond those illustrated could also be included.

The outer parts 500 may also include tabs 537, which are to secure the outer parts 500 to the memory modules 20. For example, the tabs 537 may be located so that they can be bent inward and engage with a slot 26 in the board 21 of a memory module 20, thereby restricting vertical and horizontal movement of the outer part 500 relative to the memory module 20.

In some examples, each outer part 500 is formed from a single continuous piece of thermally conductive, resilient, material. For example, the outer part 500 may be formed from a single piece of sheet metal that is worked (e.g., bent, cut, stamped, etc.). For example, the outer part 500 may be formed from a hard tempered copper or other materials mentioned with respect to the outer part 100. In some examples, the walls of the outer part may be between 0.10 mm and 0.50 mm thick.

2.2 Inner Parts 600

The inner parts 600 are similar to the inner side segments 210 described above, and thus anything said above with respect to the inner side segments 210 is also applicable to the inner parts 600 unless it is indicated otherwise below or would be logically contradictory, and will not be repeated below to avoid duplicative description. The inner parts 600 may differ from the inner side segments 210 in that the inner parts 600 are separate pieces (they are not connected together via a top segment), and they include portions that are to wrap around top and bottom edges of the outer part 500 (see FIGS. 16, 17, 22, and 23).

In particular, each inner part 600 includes a top portion 620 that is bent first inward from a main body of the inner part 600, and then is bent back outward to loop around and form a trough into which a top portion 520 of the outer part 500 may be inserted (see FIGS. 16, 17, 22, and 23). When assembled, the top portion 620 may partially cover the top portion 520 and the tops of the spring figures 512 (FIGS. 16, 17, and 23). The top portion 620 may serve to hold the inner part 600 and the outer part 500 together, and also to protect tops of the spring fingers 512.

The inner part 600 may also include a bottom portion 610 that is bent around a bottom edge of the outer part 500 (see FIGS. 16 and 24). In particular, the bottom portion 610 may initially be bent straight outward, and may be bent the rest of the way around the outer part 500 during assembly together of the inner part 500 and outer part 600. To assemble together the inner and outer parts 600, 500, the top portion 520 of the outer part 500 may be inserted into the top portion 620 of the inner part 600 (see FIG. 23A) and the bottom of the outer part 500 may be brought down into contact with the inner part 600 (see FIG. 23A), then the bottom portion 610 may be bent down around the outer part 600 (see FIG. 23B), resulting in an assembly 700 (see FIG. 23C).

Figure 24A:
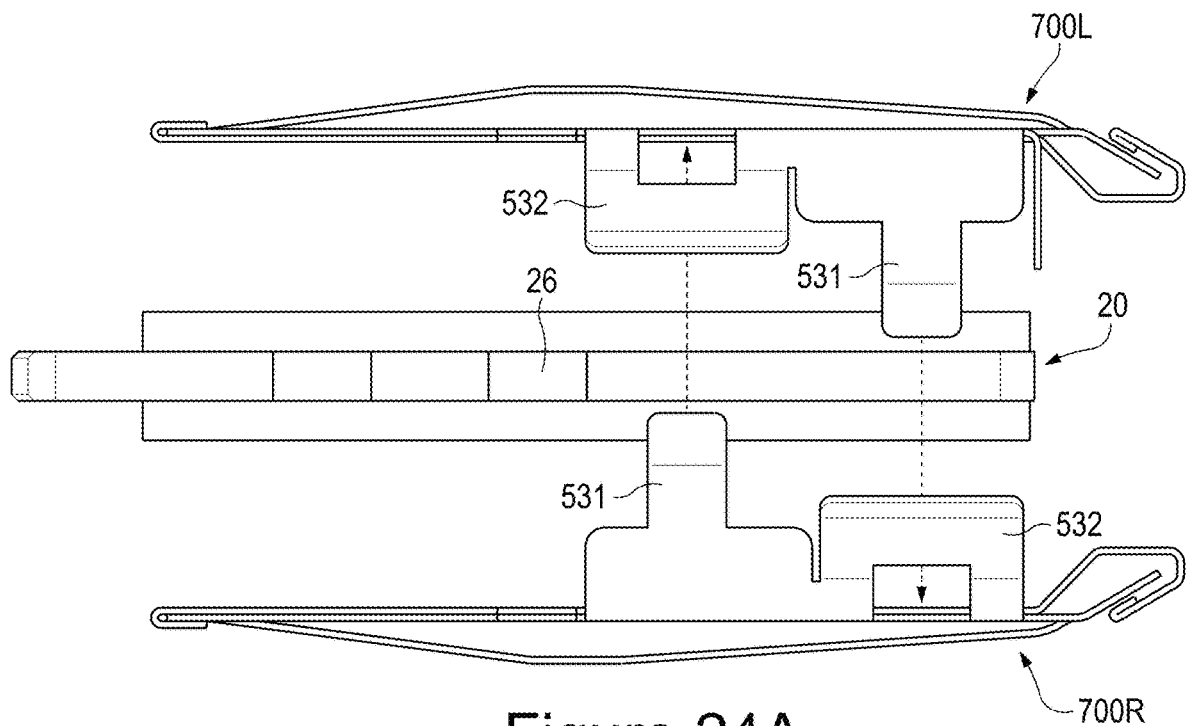
FIGS. 24A-24C illustrate a sequence of steps in assembling an inner part and an outer part of the example thermal interface device of FIG. 16 into an assembly.
Figure 24B:
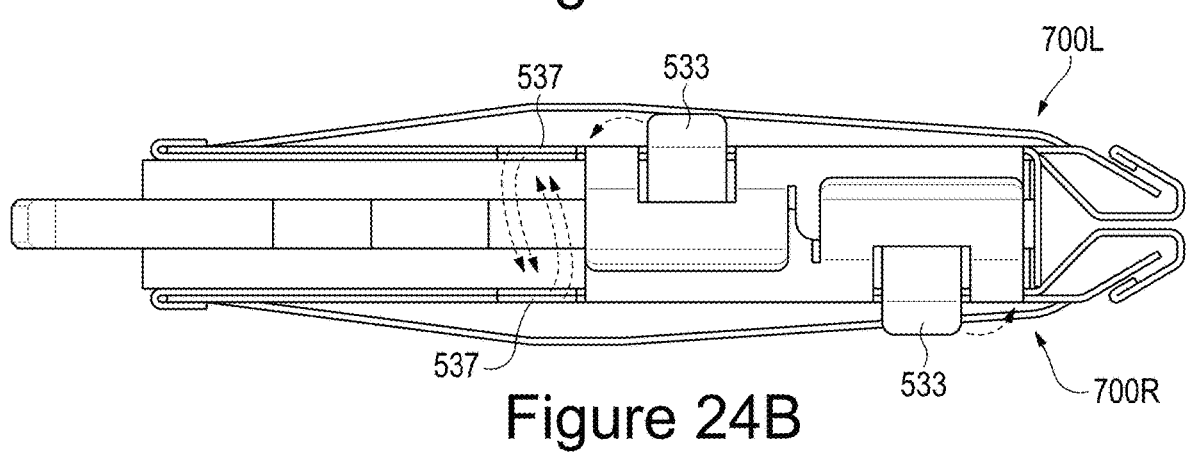
Figure 24C:
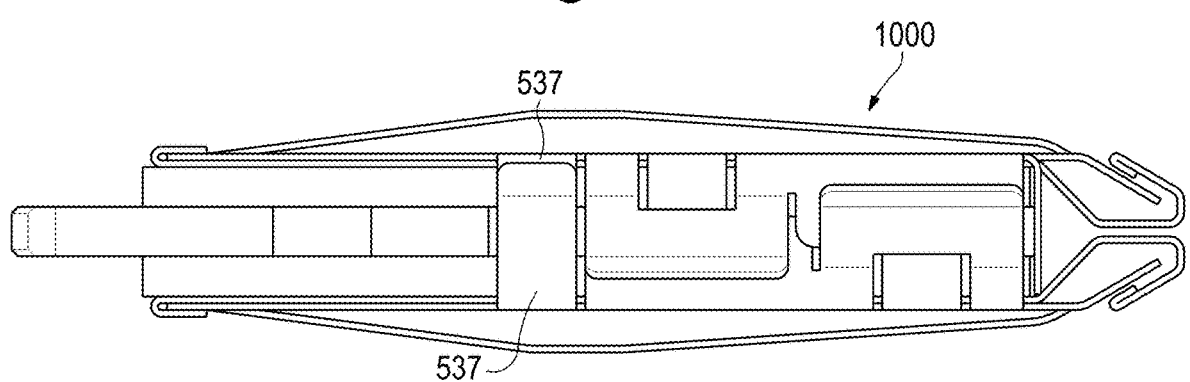

To install the interface device 1000 on a memory module, first two assemblies 700 are provided, as described above, each including an inner part 600 and an outer part 600. The assemblies 700 are then arranged on opposite sides of a memory module 20 facing one another, as shown in FIG. 24A. The assemblies are then brought together (see arrows in FIG. 24A) such that the attachment features 530 of one outer part 500 engage with the complementary attachment features 530' of the other outer part 500, as described above (see FIG. 24B). As shown in FIG. 24B, each tab 531 may slide partially under the corresponding receptacle 532, and the end portion 533 of each tab 531 may pass through the opening 534 of the corresponding receptacle 532. The end portion 533 of each tab 531 may be bent down towards the outer parts 500, as indicated by the arrows in FIG. 24B. The tabs 537 may also be bent down to engage the slot 26, as indicated by the arrows in FIG. 24B. This results in the two assemblies 700 be attached to one another and to the memory module 20, as shown in FIG. 24C.

In some examples, the inner part 600 is formed from a single continuous piece of thermally conductive, malleable, material, similar to the inner part 200 described above. For example, the inner part 600 may be formed from a single piece of malleable sheet metal that is worked (e.g., bent, cut, stamped, etc.). In some examples, the walls of the inner part 600 may be between 0.05 mm and 0.50 mm mm thick. In some examples, the inner part 200 has an electrically insulating layer 211 disposed on its inward facing surface, as described above with respect to the inner part 200.

2.3 Example Computing Systems

The interface device 1000 is designed to be installed on a memory module 20 of a computing system 400' in the same manner as the interface device 10 described above. The computing system 400' with the interface devices 1000 may be essentially the same as the computing system 400 with the interface devices 10, and thus everything said about the computing system 400 above is also applicable to computing system 400'. Thus, description of features of the computing system 400' that are similar to features of the computing system 400 will be omitted below to avoid duplicative description.

Figure 26:
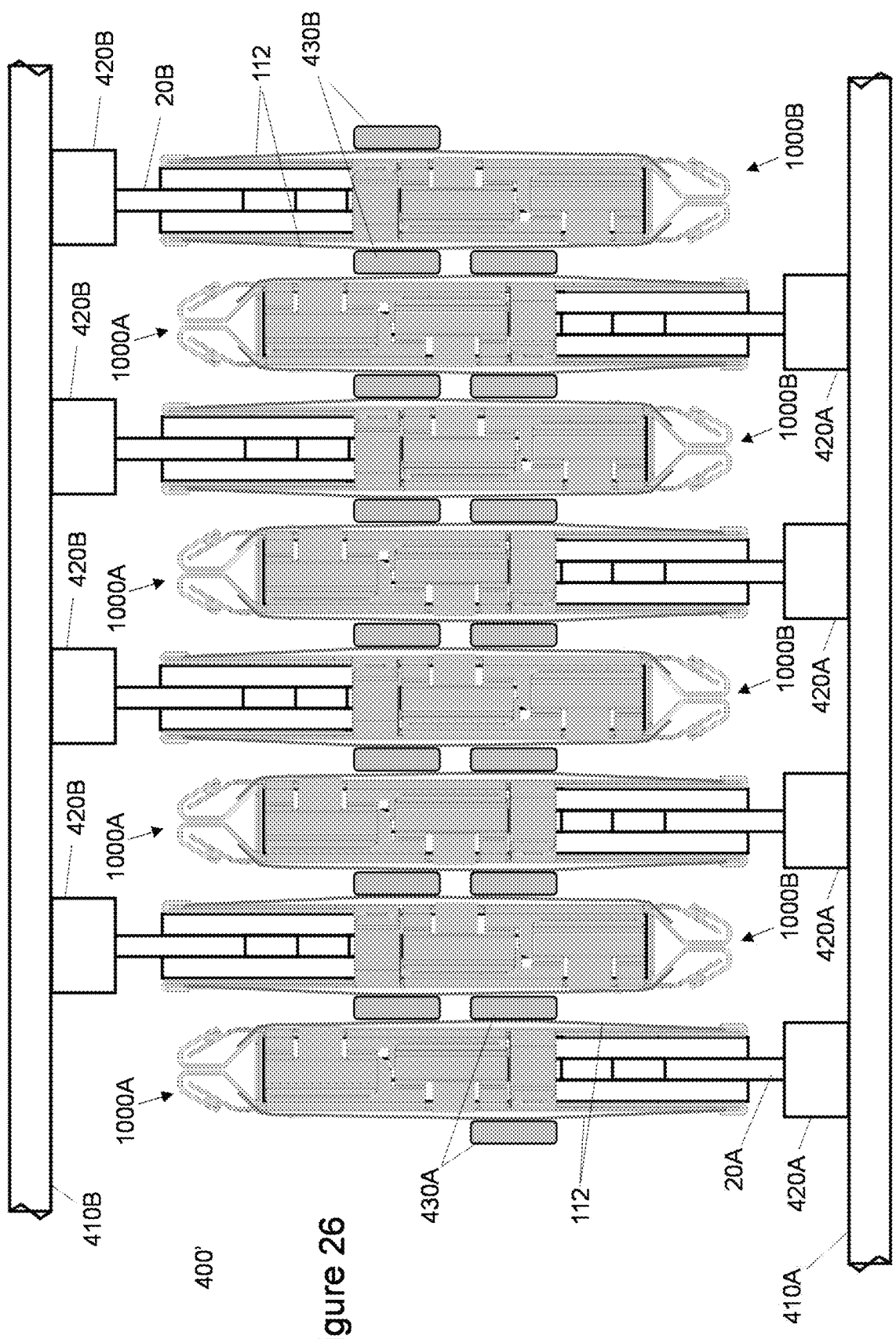
FIG. 26 illustrates an example computing device with a twinned-board configuration that includes the example interface device of FIG. 16.

In particular, FIG. 25 illustrates an example in which computing system 400' includes a single PCA 410, and FIG. 26 illustrates an example in which the computing system 400' has a twinned-board configuration and includes two PCAs 410. Although no heat-sink or cold plate 440 is illustrated in FIGS. 25-26, it should be understood that the thermal transfer devices 430 may be connected to a heat sink or cold plate 440, in the same manner as described above with respect to the computing device 400.

Although the interface device 10 and 1000 are described above as being for cooling memory modules 20, it should be understood that they could be used to cool any heat-generating component that can be received between the two side segments 210 or between the two assemblies 700. For example, the interface device 10 and 1000 could be used to cool a storage device (e.g., sold state drive), an expansion card (e.g., PCIe expansion card, M.2 expansion card, etc.), an accelerator module, etc.

Resilient: As used herein, a material is "resilient" if it has a yield strength of 32 ksi (220 MPa) or greater.

Elastic Displacement: As used herein, a spring finger is capable of being "elastically displaced" if it elastically deforms in response to its contact surface 113 being displaced up to (a) 2 mm inwards, or (b) to the point that it is flush with a planar portion the part the spring finger extends from. The spring finger "elastically deforms" if the deformations resulting from the displacement are not permanent and the spring finger substantially returns to its original configuration when the force that caused the displacement is removed.

Malleable: As used herein, a material is "malleable" if it has a yield strength of 20 ksi (138 MPa) or less, or if it has a Vickers Hardness of 60HV or less, or if it has a Rockwell B-Scale Hardness of 20 or less. A material is "more malleable" than another material if it has a lower yield strength or a lower hardness measure (e.g., Vickers Hardness, Rockwell B-Scale Hardness) than the other material.

Thermal Transfer Device: As used herein, "thermal transfer device" refers to any device that is thermally conductive and that is configured to receive heat from one solid body via conduction (contact) and transfer the heat into a second solid body via conduction (contact). Examples include heat pipes, vapor chambers, heat spreaders, a solid bar or strip of metal, etc.

Heat pipe: As used herein, "heat pipe" refers to a specific type of thermal transfer device that includes a case (vessel) having walls that surround a sealed interior channel containing a working fluid and a wick such that the fluid transfers heat between different regions of the device by a cycle of vaporization and condensation.

Heat sink: As used herein, a "heat sink" is a device that receives heat from a solid body via conduction (contact) and dissipates that heat into air that flows around/through the heatsink. A heat sink is distinguished from other bodies that dissipate heat into air by the fact that the heat sink is specialized for this task, as evidenced by it including features, such as fins or pins, to increase the surface area of its portions that are in contact with the air to improve heat dissipation.

Liquid Cooled Cold Plate: As used herein, "liquid cooled cold plate" and "cold plate" refer to a device that receives heat from a solid body via conduction (contact) and dissipates that heat into liquid coolant that flows on or through the cold plate. The liquid coolant is either (a) in direct contact with the cold plate (e.g., flowing through an interior chamber of the cold plate) or (b) flowing through a pipe/tube that is in contact with the cold plate.

Thermal Interface Material (TIM): As used herein, "thermal interface material" and "TIM" refer to relatively thin, thermally conductive, and compliant (easily deformable) material placed between two devices at their thermal interface to improve heat transfer rates by filling air gaps that would otherwise occur between the devices due to surface roughness and/or misalignment. Common examples include thermal gap pads, thermal grease, thermal paste.

Thermally couple: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermal transfer device (or to a chain of thermally coupled thermal transfer devices), or (3) a heat transfer coefficient between the two objects is $10 \text{ W} \cdot \text{m}^{-2} \cdot \text{K}^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 1 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} \cdot K^{-1}$ between 0° C. and 100° C. include almost all metals and their alloys (e.g., copper, aluminum, gold, etc.), some plastics (e.g., TECA-COMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 100 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} \cdot K^{-1}$ or greater between 0° C. and 100° C. include certain types of copper, aluminum, silver, and gold.

Inward and Outward: As used herein, "inward" refers to a direction fixed relative to one side an interface device that points towards the memory module when the interface device is installed, and "outward" refers to an opposite direction (a direction fixed relative to a side of the interface device that points away from the memory module when installed). Note that inward and outward are relative to the side of the interface device being discussed, and thus different directions may be considered to be "inward" or "outward" depending on which side of the interface device is under consideration. Specifically, the direction that is inward relative to a left side of the device is outward relative to the right side of the device.

Vertical, Up, and Down: As used herein, vertical refers to a dimension of the interface device and/or memory module that would be perpendicular to a top face of the printed circuit board when the interface device and memory module are installed on the printed circuit board. Up and down run along this vertical dimension, with up pointing away from the printed circuit board and down pointing towards the printed circuit board.

Horizontal: refers to a dimension perpendicular to the vertical dimension.

Computer. As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Provide: As used herein, to "provide" an item means to have possession of and/or control over the item. This may include, for example, forming (or assembling) some or all of the item from its constituent materials and/or, obtaining possession of and/or control over an already-formed item.

A number: Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A device, comprising:
   an outer part formed from a first material that is thermally conductive, the outer part including two outer side segments connected together by an outer top segment; and
   an inner part formed from a second material that is thermally conductive and more malleable than the first material, the inner part including two inner side segments connected together by an inner top segment,
   wherein each of the outer side segments includes multiple spring fingers extending outward that can be elastically displaced,
   the inner part is to be nested within the outer part and making contact therewith, and the inner side segments are to contact opposite sides of a memory module when the device is installed on the memory module.

2. The device of claim 1, wherein, each of the outer side segments includes a planar portion and each of the spring fingers extends outward from the planar portion and includes a contact surface that is approximately parallel to the planar portion.

3. The device of claim 1, wherein the first material is resilient and the second material is malleable.

4. The device of claim 3, wherein the second material is metal.

5. The device of claim 1, wherein the outer top portion and the inner top portion include folds to allow respective widths of the outer part and the inner part to be changed.

6. The device of claim 1, wherein the inner part includes an electrically insulating coating on an inward facing side.

7. A method, comprising:
providing the device of claim 1; and
installing the device of claim 1 on the memory module by, with the inner part nested within the outer part, sliding the device of claim 1 over a top of the memory module.

8. The method of claim 7, comprising:
installing a thermal transfer device to remove heat from the device of claim 1, such that the thermal transfer device is in contact with and displacing at least some of the spring fingers.

9. A computing system, comprising:
a printed circuit assembly with memory modules installed in memory sockets;
the device of claim 1 installed on one of the memory modules with the inner part nested within the outer part;
a thermal transfer device in contact with and displacing at least some of the spring fingers;
a heat removal system thermally coupled to the thermal transfer device.

10. The computing system of claim 9, wherein the heat removal system includes a liquid-cooled cold plate thermally coupled to the thermal transfer device to transfer heat from the thermal transfer device to a liquid coolant.

11. The computing system of claim 9, wherein the inner part is in direct contact with the memory module without an intervening thermal interface material.

12. A computing system, comprising:
two printed circuit assemblies, each with multiple memory modules installed in memory sockets, the printed circuit assemblies facing one another with their memory modules interdigitated;
multiple thermal interface devices, one for each of the memory modules, each being an instance of the device of claim 1 with the inner part nested within the outer part;
multiple thermal transfer devices interleaved between the memory modules, each in contact with and displacing at least some of the spring fingers of at least one of the thermal interface devices; and
a heat removal system thermally coupled to the thermal transfer devices.

13. A device, comprising:
two outer parts formed from a thermally conductive and resilient material and two inner parts formed from a thermally conductive and malleable metal,
wherein each of the outer parts includes:
a main body;
multiple spring fingers extending outward from the main body that can be elastically displaced, and
attachment features extending inward from opposite ends of the main body,
the inner parts are to be attached to the outer parts, respectively, forming two assemblies,
the assemblies are to be attached together by the attachment features of one of the outer parts interacting with the attachment features of the other one of the outer parts; and
the inner parts are to contact opposite sides of a memory module when the assemblies are attached together and the device is installed on the memory module.

14. The device of claim 13, wherein each of the inner parts includes a top flange and a bottom flange to attach the respective inner part to one of the outer parts.

15. The device of claim 14, wherein for each of the inner parts, when the respective inner part is attached to one of the outer parts, the top flange of the respective inner part covers top ends of the spring fingers of the respective outer part.

16. The device of claim 13, wherein pairs of the spring fingers are connected together at one end thereof.

17. The device of claim 13, wherein, for each of the outer parts, the attachment features include a first attachment feature at one end of the body and a second attachment that is complementary to the first attachment feature at an opposite end of the body.

18. A method, comprising:
providing the device of claim 13; and
installing the device of claim 13 on the memory module by, with the inner parts attached to the outer parts, respectively, and the assemblies attached together, sliding the device of claim 13 over a top of the memory module.

19. The method of claim 18, comprising:
installing a thermal transfer device to remove heat from the device of claim 13, such that the thermal transfer device is in contact with and displacing at least some of the spring fingers.

20. A computing system, comprising:
a printed circuit assembly with memory modules installed in memory sockets;
the device of claim 13 installed on one of the memory modules with the inner parts attached to the outer parts, respectively, and the assemblies attached together;
a thermal transfer device in contact with and displacing at least some of the spring fingers; and
a heat removal system thermally coupled to the thermal transfer device.

* * * * *